US007882480B2

(12) United States Patent
Ye et al.

(10) Patent No.: US 7,882,480 B2
(45) Date of Patent: Feb. 1, 2011

(54) SYSTEM AND METHOD FOR MODEL-BASED SUB-RESOLUTION ASSIST FEATURE GENERATION

(75) Inventors: Jun Ye, Palo Alto, CA (US); Yu Cao, Cupertino, CA (US); Hanying Feng, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 394 days.

(21) Appl. No.: 11/757,805

(22) Filed: Jun. 4, 2007

(65) Prior Publication Data
US 2008/0301620 A1 Dec. 4, 2008

(51) Int. Cl.
G06F 17/50 (2006.01)
(52) U.S. Cl. .......................................... 716/19; 716/21
(58) Field of Classification Search ............. 716/19–21; 430/5, 22
See application file for complete search history.

(56) References Cited

U.S. PATENT DOCUMENTS

| 7,147,976 | B2 * | 12/2006 | Liebmann et al. | 430/5 |
|---|---|---|---|---|
| 7,480,891 | B2 * | 1/2009 | Sezginer | 716/21 |
| 7,506,300 | B2 * | 3/2009 | Sezginer et al. | 716/19 |
| 7,523,435 | B2 * | 4/2009 | Bollepalli et al. | 716/19 |
| 7,552,416 | B2 * | 6/2009 | Granik et al. | 716/19 |
| 2004/0229133 | A1 | 11/2004 | Socha et al. | |
| 2005/0149900 | A1 | 7/2005 | Laidig et al. | |
| 2005/0149902 | A1 | 7/2005 | Shi et al. | |
| 2005/0185159 | A1 | 8/2005 | Rosenbluth et al. | |
| 2005/0273753 | A1 | 12/2005 | Sezginer | |
| 2006/0200790 | A1 | 9/2006 | Shang et al. | |
| 2006/0236294 | A1 * | 10/2006 | Saidin et al. | 716/19 |
| 2006/0248495 | A1 * | 11/2006 | Sezginer | 716/19 |
| 2006/0269875 | A1 * | 11/2006 | Granik | 430/311 |
| 2006/0291714 | A1 * | 12/2006 | Wu et al. | 382/149 |
| 2007/0101310 | A1 | 5/2007 | Stirniman et al. | |
| 2008/0008972 | A1 | 1/2008 | Muelders et al. | |

FOREIGN PATENT DOCUMENTS

EP 2 439 420 7/2004

OTHER PUBLICATIONS

Cao, Yu et al. "Optimized Hardware and Software for Fast, Full Chip Simulation" Optical Microlithography XVIII, Proceedings of SPIE vol. 5754, (SPIE, Bellingham, WA, 2005).

(Continued)

*Primary Examiner*—Jack Chiang
*Assistant Examiner*—Binh C Tat
(74) *Attorney, Agent, or Firm*—Pillsbury Winthrop Shaw Pittman LLP

(57) ABSTRACT

Methods are disclosed to create efficient model-based Sub-Resolution Assist Features (MB-SRAF). An SRAF guidance map is created, where each design target edge location votes for a given field point on whether a single-pixel SRAF placed on this field point would improve or degrade the aerial image over the process window. In one embodiment, the SRAF guidance map is used to determine SRAF placement rules and/or to fine tune already-placed SRAFs. In another embodiment the SRAF guidance map is used directly to place SRAFs in a mask layout.

16 Claims, 11 Drawing Sheets

OTHER PUBLICATIONS

Cobb, Nicholas et al. "Dense OPC for 65nm and below" 25th Annual BACUS Symposium on Photomask Technology, Proc. of SPIE vol. 5992, 599259, (2005).

Martin et al. "Exploring new high speed, mask aware RET verification flows" Photomask and Next-Generation Lithography Mask Technology XII, Proceedings of SPIE vol. 5853, (SPIE, Bellingham, WA 2005).

Spence, Chris "Full-Chip Lithography Simulation and Design Analysis—How OPC is changing IC Design" Emerging Lithographic Technologies IX, Proceedings of SPIE vol. 5751 (SPIE, Bellingham, WA, 2005).

International Search Report issued Oct. 7, 2008 in corresponding PCT/US2008/065656.

* cited by examiner

SYSTEM AND METHOD FOR MODEL-BASED SUB-RESOLUTION ASSIST FEATURE GENERATION

FIELD OF THE INVENTION

This invention relates generally to resolution enhancement techniques for photolithography and relates more particularly to a system and method for model-based sub-resolution assist feature generation.

BACKGROUND

The integrated circuit industry has, since its inception, maintained a remarkable growth rate by driving increased device functionality at lower cost. One of the primary enabling factors of this growth has been the ability of optical lithography to steadily decrease the smallest feature size that can be formed as part of the integrated circuit pattern. The steady decline in feature size and cost and the corresponding increase in the density of features printed per circuit are commonly referred to as "Moore's Law" or the lithography "roadmap."

The lithography process involves creating a master image on a mask or reticle (mask and reticle are used interchangeably herein), then projecting an image from the mask onto a resist-covered semiconductor wafer in order to create a pattern that matches the design intent of defining functional elements, such as transistor gates, contacts etc., on the wafer. The more times a master pattern is successfully replicated on a wafer within the design specifications, the lower the cost per finished device or "chip" will be. Until recently, the mask pattern has been an almost exact duplicate of the desired pattern at the wafer level, with the exception that the mask level pattern may be several times larger than the wafer level pattern, due to an imaging reduction ratio of the exposure tool. The mask is typically formed by depositing and patterning a light absorbing material on quartz or another transparent substrate. The mask is then placed in an exposure tool known as a "stepper" or "scanner" where light of a specific exposure wavelength is directed through the mask onto the wafers. The light is transmitted through clear areas of the mask, but is attenuated by a desired amount, typically between 90 and 100%, in the areas covered by the absorbing layer. The light that passes through some regions of the mask may also be phase shifted by a desired phase angle, typically an integer multiple of 180 degrees. After being collected by the projection optics of the exposure tool, the resulting aerial image pattern is then focused onto the wafers. A light-sensitive material (photoresist or resist) deposited on the wafer surface interacts with the light to form the desired pattern on the wafer, and the pattern is then transferred into the underlying layers on the wafer to form functional electrical circuits according to well-known processes.

In recent years, the feature sizes being patterned have become significantly smaller than the wavelength of light used to transfer the mask pattern onto the wafer. This trend towards "sub-wavelength lithography" has resulted in increasing difficulty in maintaining adequate process margins in the lithography process. The aerial images created by the mask and exposure tool lose contrast and sharpness as the ratio of feature size to wavelength decreases. This ratio is quantified by the $k_1$ factor, defined as the numerical aperture (NA) of the exposure tool times the minimum feature size $W_f$ divided by the wavelength $\lambda$, i.e., $k_1 = NA \cdot W_f / \lambda$. There is limited practical flexibility in choosing the exposure wavelength, while the numerical aperture of exposure tools is approaching physical limits. Consequently, the continuous reduction in device feature sizes requires more and more aggressive reduction of the $k_1$ factor in lithographic processes, i.e. imaging at or below the classical resolution limits of an optical imaging system.

New methods to enable low-$k_1$ lithography have used master patterns on the mask that are no longer exact copies of the final wafer level pattern. The mask pattern is often adjusted in terms of the size and placement of pattern features as a function of pattern density or pitch. Other techniques involve the addition or subtraction of extra corners on the mask pattern ("serifs," "hammerheads," and other patterns) known as Optical Proximity Correction, or OPC; and the addition of other geometries that are not intended to be replicated on the wafer at all. The sole purpose of these non-printing "assist features," also known as Sub-Resolution Assisting Features (SRAFs) or scattering bars, is to enhance the printability of the "main features." The SRAFs are typically small bars placed close to the main features so that the printability of the main features is more robust against focus and/or dose change. All of these methods are often referred to collectively as Resolution Enhancement Technology (RET). With decreasing $k_1$, the magnitude of proximity effects increases dramatically. In current high-end designs, more and more device layers require RET, and almost every feature edge requires some amount of adjustment to ensure that the printed pattern will reasonably resemble the design intent. The implementation and verification of such extensive RET application is only made possible by detailed full-chip computational lithography process modeling, and the process is generally referred to as model-based RET. (See "Full-Chip Lithography Simulation and Design Analysis—How OPC Is Changing IC Design," C. Spence, Proc. SPIE, Vol. 5751, pp. 1-14 (2005) and "Exploring New High Speed, Mask Aware RET Verification Flows," P. Martin et al., Proc. SPIE 5853, pp. 114-123, (2005)).

The cost of manufacturing advanced mask sets is steadily increasing. Currently, the cost has already exceeded one million dollars per mask set for an advanced device. In addition, the turn-around time is always a critical concern. As a result, lithography-driven RET design, which assists in reducing both the cost and turn-around time, has become an integral part of semiconductor manufacturing.

FIG. 1 is a flowchart of a prior art method for applying resolution enhancement techniques to a design layout. In step 110, a design layout that describes the shapes and sizes of patterns that correspond to functional elements of a semiconductor device, such as diffusion layers, metal traces, contacts, and gates of field-effect transistors, is obtained. These patterns represent the "design intent" of physical shapes and sizes that need to be reproduced on a wafer by the lithography process in order to achieve certain electrical functionality and specifications of the final device. The design layout is also referred to as the "pre-RET" layout.

As described above, numerous modifications to this design layout are required to create the patterns on the mask or reticle used to print the desired structures. In step 112, a variety of RET methods are applied to the design layout in order to approximate the design intent in the actually printed patterns. The resulting "post-RET" mask layout differs significantly from the "pre-RET" design layout. Both the Pre- and Post-RET layouts may be provided to the lithography simulation system in a polygon-based hierarchical data file in, e.g., the GDS or the OASIS format.

In step 114, resist contours on the wafer are simulated using the post-RET layout and a model of the lithography process. This model includes an optical model component that describes the transformation from the post-RET layout to an aerial image (AI) and a resist model component that describes the transformation from the AI to the final resist image (RI). In step 116, the simulated resist contours are extracted from the RI and compared to the design layout, and in step 118 its is determined whether the simulated resist contours are acceptable. If they are not acceptable, then the method returns to step 112 where another iteration of RET methods are applied to the pre-RET layout. If the simulated resist contours are acceptable, then the post-RET layout is output and used to manufacture a mask.

A central part of lithography simulation is the optical model component of the model of the lithography process, which simulates the projection and image forming process in the exposure tool. The optical model needs to incorporate critical parameters of the illumination and projection system: numerical aperture and partial coherence settings, illumination wavelength, illuminator source shape, and possibly imperfections of the system such as aberrations or flare. The projection system and various optical effects, e.g., high-NA diffraction, scalar or vector, polarization, and thin-film multiple reflection, may be modeled by transmission cross coefficients (TCCs). The TCCs may be decomposed into convolution kernels, using an eigen-series expansion. For computation speed, the series is usually truncated based on the ranking of eigen-values, resulting in a finite set of kernels. The more kernels that are kept, the less error is introduced by the truncation. The lithography simulation system described in U.S. Pat. No. 7,003,758 allows for optical simulations using a very large number of convolution kernels without negative impact on computation time and therefore enables highly accurate optical modeling. (See "Optimized Hardware and Software for Fast, Full Chip Simulation," Y. Cao et al., Proc. SPIE Vol. 5754, 407 (2005)).

As the lithography process entered below the 65 nm node, leading-edge chip designs have minimum feature sizes smaller than the wavelength of light used in advanced exposure tools. SRAFs become indispensable even if OPC techniques provide good results. Typically, OPC will modify the design layout so that a resist image (RI) contour is close enough to the design target at nominal condition. However, the Process Window (PW) is rather small without any extra features. SRAFs are needed to enhance the printability of the main features across a wider range of defocus and delta dose scenarios in order to maintain adequate process margins in the lithography process.

One method for implementing SRAFs that is widely in use is rule-based SRAF placement using an empirical (manual) rule-generator. In this method, a combination of benchmark test patterns with different SRAF configurations are printed (or simulated) on a wafer. Critical Dimension (CD) is then measured on the wafer, a set of rules for SRAF placement is drawn from the CD comparison, and finally the set of rules is used in SRAF placement for each main feature segment in a design. It should be noted that empirical rule-based SRAF placement requires an efficient mechanism to solve many conflicts between SRAFs derived from different main feature segments.

Another proposed method to generate SRAFs is based on inverse lithography techniques. In this method, the goal is to identify a mask image that minimizes an objective function. The objective function includes the difference between the resulting aerial image and the ideal design target image and also the difference between the aerial image intensity at the design target edge locations and the threshold for contours. To solve this non-linear programming problem, two iterative approaches are proposed to identify a local minimum solution. In the first approach, referred to as "local variations algorithm," each pixel in the mask layout is added with a hypothetical disturbance, and the resulting objective function value is compared against the one without the disturbance to decide whether this disturbance should be added or not. After all the pixels are processed in such a way, the whole process is iterated with smaller and smaller disturbances until the disturbance is small enough (thus the mask image will not change much after more iterations). In the second approach, referred to as "gradient descent algorithm," the gradient of the objective function is computed and the non-linear problem is replaced by its linear approximation. Then the linear approximation is solved iteratively until certain convergence criteria are met. (see "Dense OPC for 65 nm and below," N. B. Cobb and Y. Granik, Proc. of SPIE, Vol. 5992, pp. 1521-1532, (2005)).

While these method have demonstrated some successes, their disadvantages have slowed the development cycle and limited their usage. For example, the empirical (manual) rule-generator has the following drawbacks: unable to take into account all possible patterns/spaces/line widths in a limited number of test patterns; high cost and low speed to manufacture the mask, print the wafer, and measure CD; difficulty in measuring the SRAFs' performance across the PW; and difficulty in resolving SRAF conflicts. The inverse lithography based method is also complicated and slow, since it may require quite a few slow iterations to converge. It may also converge to a local optimum, and it is not feasible to use it directly as it generates continuous values for each pixel while only rectangular shaped patterns with mask constraints are manufacturable. In addition, the objective function includes the difference between the whole aerial image and the design target, while in practice, the fidelity of the aerial image contours is of more interest. The focus on pixels deep inside or outside main features may be counterproductive. As a result, there exists a strong need for methods to create a very fast and very efficient SRAF placement algorithm that will take 2D pattern shapes into consideration and optimize for the PW rather than a few test patterns.

SUMMARY

Methods are disclosed to create efficient model-based Sub-Resolution Assist Features (MB-SRAF). An SRAF guidance map is created, where each design target edge location votes for a given field point on whether a single-pixel SRAF placed on this field point would improve or degrade the aerial image over the process window. In one embodiment, the SRAF guidance map is used to determine SRAF placement rules and/or to fine tune already-placed SRAFs. In another embodiment the SRAF guidance map is used directly to place SRAFs in a mask layout.

In one embodiment, generating an SRAF guidance map includes computing an image gradient map of the mask layout, then for each field point in the mask layout, computing a total vote sum for a unit source at the field point using the image gradient map, and assigning values in the SRAF guidance map, wherein the value at a pixel in the SRAF guidance map is the total vote sum at a corresponding field point in the mask layout. Computing the total vote sum for a unit source in the frequency domain includes computing the inverse Fourier Transform of the most significant eigenvector of transmission cross coefficient that represent the optical path of an exposure tool, computing the Fourier Transform of the mask layout, multiplying the inverse Fourier Transform of the eigenvector by the sum square of frequency and the Fourier Transform of the mask layout to produce a product; and computing the inverse Fourier Transform of the product to produce the SRAF guidance map.

In another embodiment, generating an SRAF guidance map includes computing a bilinear SRAF guidance map kernel using transmission cross-coefficients that represent the optical path of an exposure tool, computing a linear SRAF guidance map kernel using the transmission cross-coefficients, computing a partial SRAF guidance map using the bilinear SRAF guidance map kernel and the mask layout, computing a second partial SRAF guidance map using the linear SRAF guidance map kernel and the mask layout, and combining the two partial SRAF guidance maps.

DETAILED DESCRIPTION OF THE DRAWINGS

Figure 1:
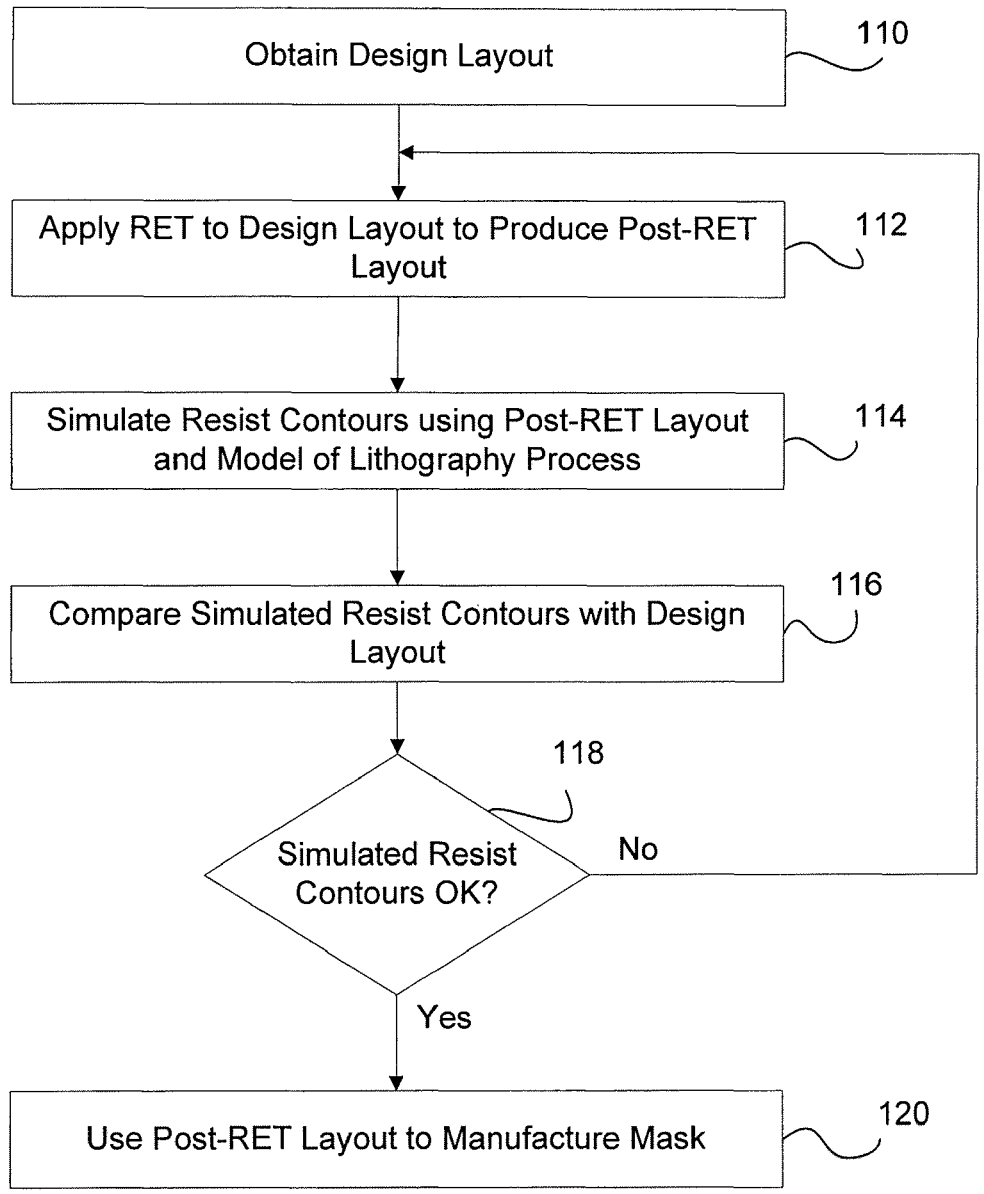
FIG. 1 is a flowchart of a prior art method for applying resolution enhancement techniques to a design layout.
Figure 2:
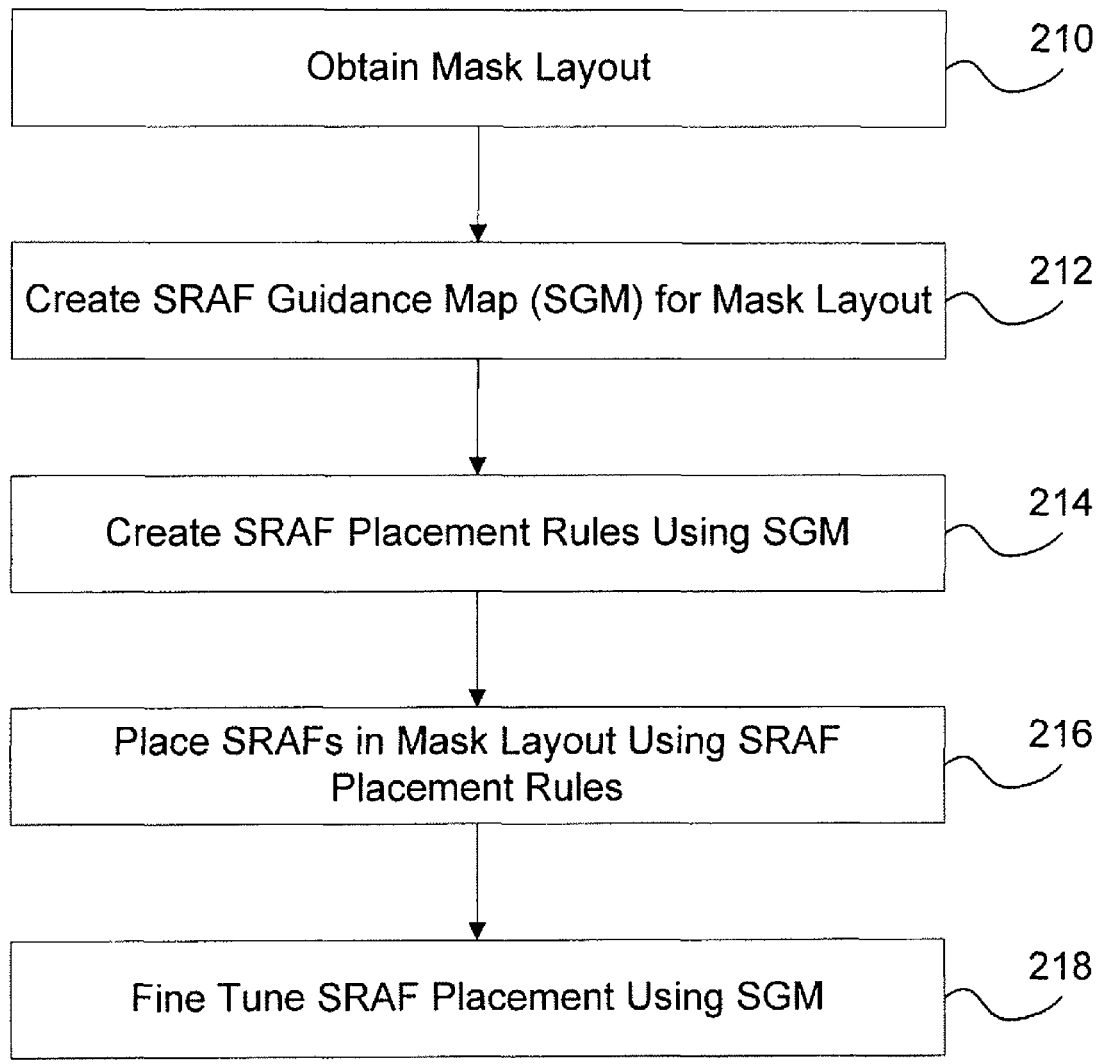
FIG. 2 is a flowchart of method steps for generating model-based sub-resolution assist features, according to one embodiment of the invention.

FIG. 2 is a flowchart of method steps for generating model-based sub-resolution assist features, according to one embodiment of the invention. In step 210, a mask layout is obtained. The mask layout is the pre-OPC (design) layout. In step 212, an SRAF guidance map (SGM) is created for the mask layout. The SGM is an image in which each pixel value is an indication of whether the pixel would contribute positively to through-focus and through-dose edge behavior of features in the mask layout if the pixel is included as part of an SRAF. If the SGM value for a pixel is positive, then a unit source (i.e., a single pixel SRAF) at that pixel location would improve the overall through-focus and through-dose edge behavior, and the larger the SGM value, the greater the improvement. Creating the SGM is further described below in conjunction with FIGS. 4 and 5. In step 214, SRAF placement rules for the mask layout are created using the SGM. Creation of SRAF placement rules based on the SGM is further described below in conjunction with FIGS. 6A, 6B, and 6C. In step 216, SRAFs are placed in the post-OPC layout using the SRAF placement rules. In optional step 218, the placed SRAFs are fine tuned using the SGM. For example, the SGM may indicate that a placed SRAF should be slightly wider than the width dictated by the rule.

Figure 3:
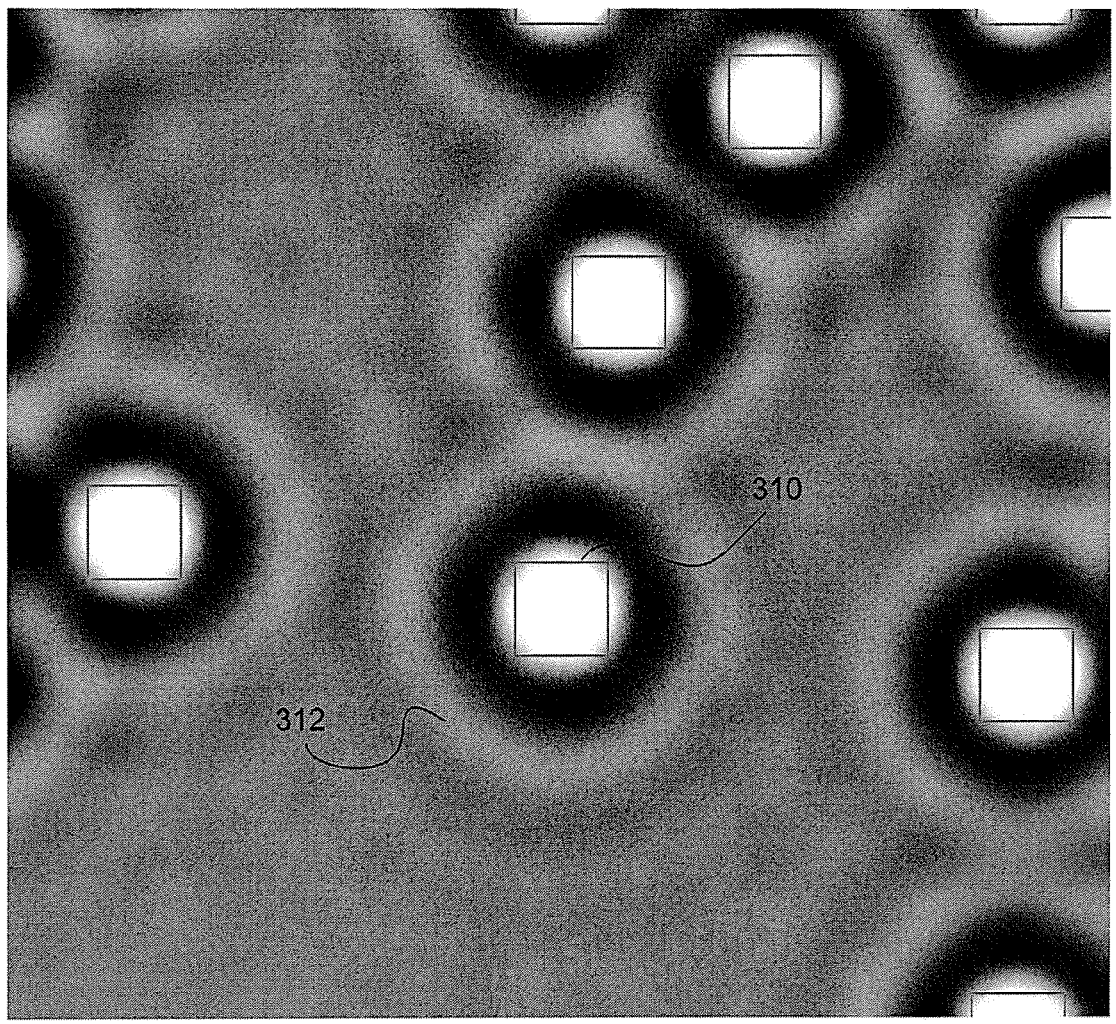
FIG. 3 is one embodiment of an SRAF guidance map (SGM) for a design layout of a contact layer, according to the invention.

FIG. 3 is one embodiment of a SRAF guidance map (SGM) for a design layout of a contact layer, according to the invention. Bright regions indicate pixels with a positive SGM value. Pixels within and immediately adjacent to the design features, such as contact 310, appear the brightest. If mask rule check and SRAF printability issues are not considered, pixels in bright regions not within or immediately adjacent to the features, such as region 312, are suitable for inclusion in an SRAF. Pixels in dark regions, which are pixels with a negative SGM value, are not suitable for inclusion in an SRAF. An SGM can be generated for a mask layout of any mask layer. Dark-field masks are assumed throughout; however the techniques of the invention may be applied to any type of mask used in any type of exposure tool.

Through-focus and through-dose edge behavior can be described using the edge slope of the aerial image at the design target edge locations. A higher edge slope improves the process window robustness of the feature, both for changes in dose and for defocus. Dose change is essentially a threshold change and defocus can be well approximated by a low-pass blurring effect. High edge slope improves the robustness against variations in both dose and defocus, which improves the overall process window. So the goal of improving process window robustness is transformed into the goal of increasing the edge slope at the design target edge locations.

Figure 4:
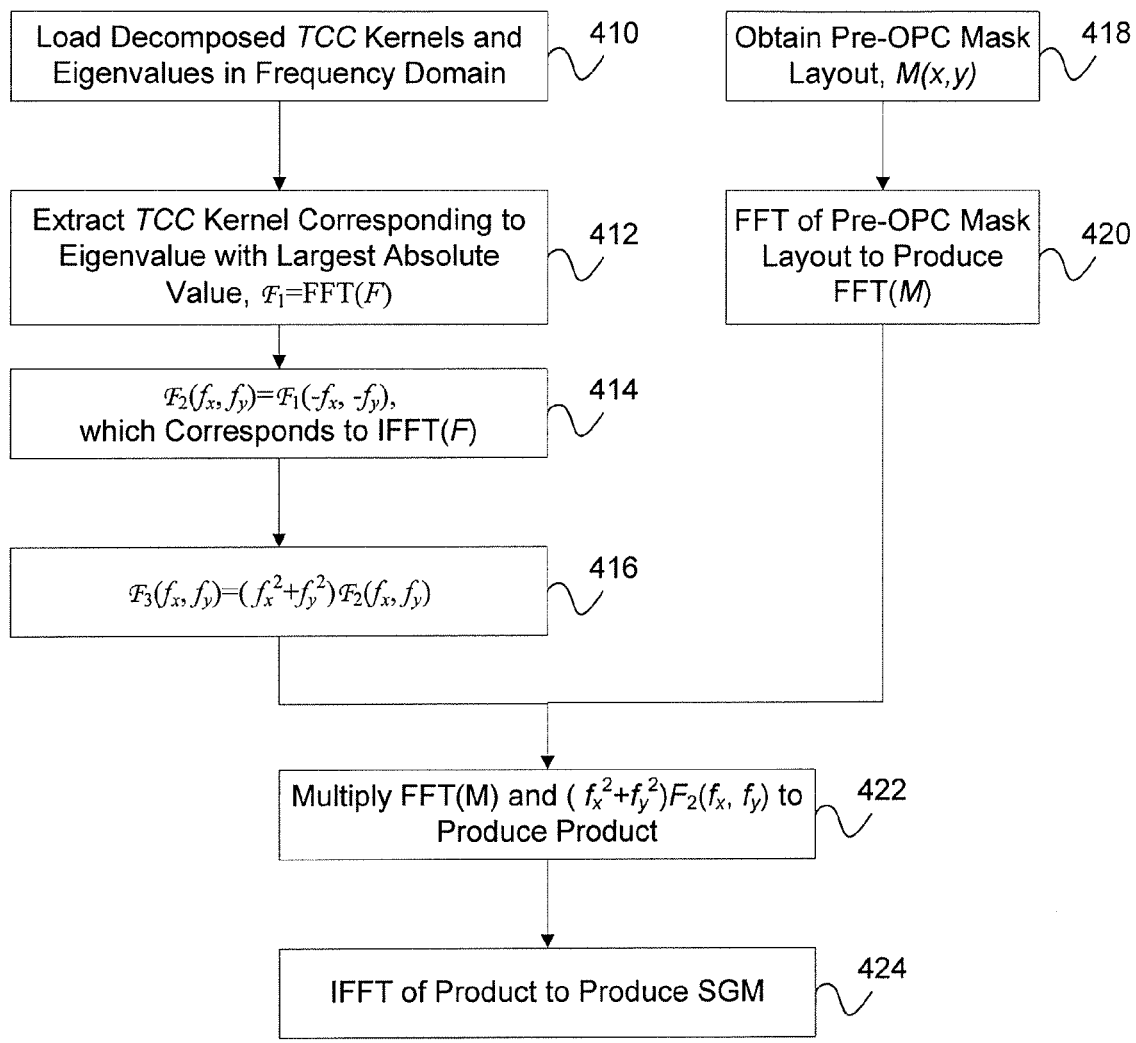
FIG. 4 is a flowchart of method steps for generating an SRAF guidance map (SGM) according to one embodiment of the invention.

FIG. 4 is a flowchart of method steps for generating an SRAF guidance map (SGM) according to one embodiment of the invention. The method of FIG. 4 is a single-kernel approach in which it is assumed that the optical path of the exposure tool is "near" coherent and only the first term of the TCC for the exposure tool is considered.

The partial coherent aerial image intensity can be formulated as the following:

$$I = L_0^*(M \otimes F_0)^2 + L_1^*(M \otimes F_1)^2 + \ldots + L_n^*(M \otimes F_n)^2$$

Where: M is the mask image; n is the number of eigenvalues of the Transmission Cross Coefficients (TCCs); $F_0$ to $F_n$ are the real-space filters corresponding to each TCC term; $L_0$ to $L_n$ are the corresponding eigenvalues of each TCC term; "$\otimes$" means convolution, and "*" is the regular multiplication.

In the single kernel approach of FIG. 4, the emphasis is on the aerial image amplitude from the kernel corresponding to the eigenvalues with the largest absolute value, then:

$$A = \sqrt{I} \approx M \otimes F$$

where $F = F(x,y)$ is a scalar field. This field's gradient vector is denoted as $\vec{D}$: $\vec{D}(x, y) = (D_x, D_y)$ where $(D_x, D_y)$ is a vector field with two components:

$$D_x = \frac{\partial F}{\partial x} \quad D_y = \frac{\partial F}{\partial y}$$

For an edge, its edge vector $\vec{E}$ is defined as the following: its direction is perpendicular to the edge, and points to the direction with positive edge slope in aerial image A. Now, from one edge location, the edge's environment is considered as a field. Assuming that the unit source is at the field location (x,y), then the aerial image amplitude for an arbitrary point $(x_1, y_1)$ is $F(x_1-x, y_1-y)$. This unit source's contribution to the slope of the edge point, which is located at (x',y'), is proportional to:

$$S(x,y,x',y') = \vec{D}(x'-x, y'-y) * \vec{E}(x',y')$$

where "*" denotes an inner vector multiplication, so the result is a scalar S(x,y,x',y'). So, for each edge point, every field location's contribution to its slope can be calculated. Unit sources at some field locations will give positive contribution, some negative. This contribution can then be regarded as the "vote" by this edge point on whether that field point in the mask layout should be placed with a unit source.

Now, for each field point, the "votes" from all edge points are integrated to produce an integrated final vote for this field point. This final vote is on whether this field point should be placed with a unit source. Hence, a threshold is applied to this vote field to decide where to place the SRAF.

One problem arises if such a filtering operation is used is that it is applied per edge point. Since the edge point could be very irregular, this operation may be quite computationally expensive. Other disadvantages of this brute-force vote count scheme are: (1) edges are sampled, so the effects from a continuous edge are not considered; (2) corners' edge location is from the pre-OPC layout's sharp corners, which is actually not the desired contour target location. The true target contour of a corner is actually a round corner, and the slope on that round contour should be enhanced.

To address this problem, the above-described vote-counting operation is transformed into a classical image processing algorithm, enabling the vote count using three Fast Fourier Transform (FFT) operations. By formulating the vote counting process using FFT operations, the computation speed is vastly improved, with or without hardware accelerations, such as use of the full-chip lithography simulation system disclosed in U.S. Pat. No. 7,003,758. Furthermore, using FFT computations automatically overcomes the two disadvantages mentioned above. All edges are continuously considered, and corners are rounded (the rounding amount depends on the pixel size).

In step 418, a pre-OPC mask layout M(x,y) is obtained. The gradient map $\vec{G}(x, y) = (G_x, G_y)$ of the pre-OPC mask layout is a vector map composed of:

$$G_x = \frac{\partial M(x, y)}{\partial x} \quad G_y = \frac{\partial M(x, y)}{\partial y}$$

Now, the exact edge points are all the points that have gradients. The vote on a particular field point comes from every point in the mask image with a non-zero gradient, based on whether a unit source on that field point will enhance the gradient. For a unit source at field point (x,y), its contribution to a gradient value at (x',y') is:

$$v(x, y, x', y') = \vec{D}(x'-x, y'-y) * \vec{G}(x', y')$$
$$= G_x(x', y')D_x(x'-x, y'-y) -$$
$$G_y(x', y')D_y(x'-x, y'-y)$$

Again, "*" represents an inner vector multiplication. The "v" value can be treated as the vote from the gradient at (x,y) to the field point (x',y'), so the total vote sum from the unit source at field point (x,y) is $$V(x, y) = \sum_{(x',y')} v(x, y, x', y')$$
$$= \sum_{(x',y')} \begin{bmatrix} G_x(x', y')D_x(x'-x, y'-y) + \\ G_y(x', y')D_y(x'-x, y'-y) \end{bmatrix}$$

$G_x$ and $G_y$ are the two gradient component images of M(x,y), and $D_x$ and $D_y$ are prior known filters. The SUM operation is now a standard convolution filtering on a regular image grid. So V can be computed by two filtering operations. These two filtering operations are quite expensive if performed in real-space, since $D_x$ and $D_y$ are non-separable large filters. So, to make these two filtering operations manageable, they are performed in the frequency domain. In the frequency domain, there is no need to compute $G_x$ and $G_y$ explicitly. Instead, $G_x$ and $G_y$ can be computed directly from M(x,y).

If Z(x) is an arbitrary function, FFT(Z(x)) is its Fourier Transform, and F(x)=dZ/dx is its derivative, then the Fourier Transform of Z'(x) is $$FFT(Z'(x)) = ifFFT(Z(x))$$

Where i is the imaginary unit, f is the frequency. As a result, $$FFT(G_x) = if_xFFT(M), FFT(G_y) = if_yFFT(M)$$

$$FFT(D_x) = if_xFFT(F), FFT(D_y) = if_yFFT(F)$$

So the total vote sum, the SGM value, at field point (x,y), is $$V(x, y) = \sum_{(x',y')} \begin{bmatrix} G_x(x', y')D_x(x'-x, y'-y) + \\ G_y(x', y')D_y(x'-x', y'-y) \end{bmatrix}$$
$$= G_x(x, y) \otimes D_x(-x, -y) - G_y(x, y) \otimes D_y(-x, -y)$$
$$= -IFFT(FFT(G_x) * IFFT(D_x) + FFT(G_y) * IFFT(D_y))$$
$$= IFFT((f_x^2 + f_y^2)FFT(M) * IFFT(F))$$

Where IFFT(•) represents the inverse Fast Fourier Transform, "⊗" means convolution, and "*" is the regular multiplication. Since $\mathcal{F}_3(f_x,f_y) = (f_x^2+f_y^2)IFFT(F)$ can be pre-computed because the optical model is the same for any mask, the real-time computation of the SGM value at each field point only involves two FFT computations: FFT(M) and one IFFT. In step 420, an FFT is applied to the pre-OPC mask layout to produce FFT(M). A TCC is typically decomposed into convolution kernels, using an eigen-series expansion for computation speed and storage. Therefore, in step 410, a decomposed version of TCC is loaded, and then in steps 412 and 414, FFT(F) is converted to IFFT(f). In step 416, $\mathcal{F}_3(f_x,f_y) = (f_x^2+f_y^2)IFFT(F)$ is computed. Then, in step 420, $\mathcal{F}_3(f_x,f_y)$ is multiplied by FFT(M) and in step 422, the IFFT is taken of the product to produce the SGM for the entire pre-OPC design layout.

Figure 5:
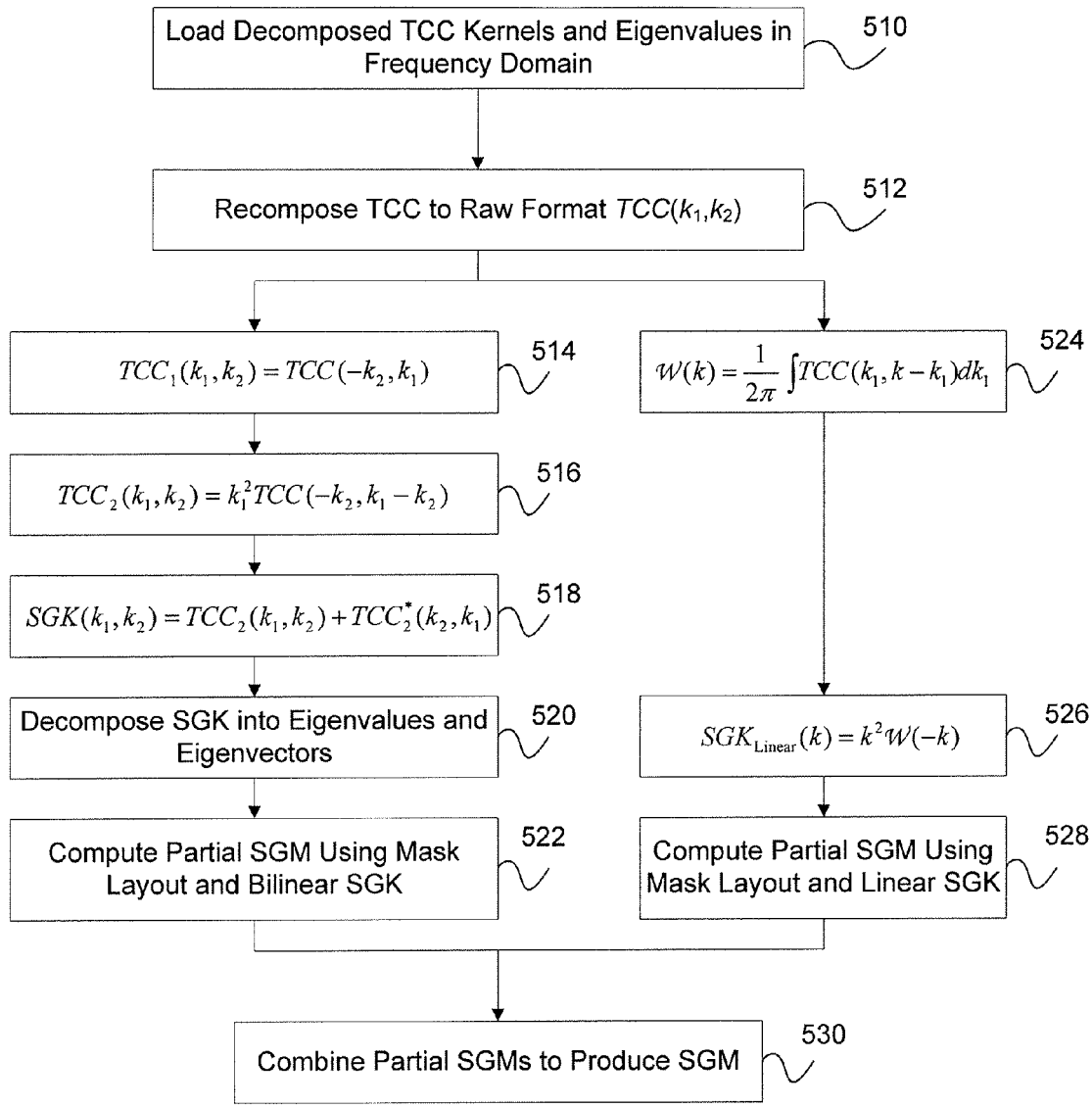
FIG. 5 is a flowchart of method steps for generating an SRAF guidance map (SGM) according to another embodiment of the invention.

FIG. 5 is a flowchart of method steps for generating an SRAF guidance map (SGM) according to another embodiment of the invention. The FIG. 5 embodiment is a multi-kernel approach in which the optical path of the exposure tool is not assumed to be near coherent. For ease of discussion, the following equations are written as if there is only one spatial dimension.

Mask transmittance M(x) is separated into a pre-OPC component (T), an SRAF component (A) and an OPC corrections component (C):

$$M(x) = M^T(x) + M^A(x) + M^C(x)$$

If $$M^K(x) = M^T(x) + M^C(x)$$

represents the post-OPC layout transmittance, then the aerial image (AI) intensity is $$I(x) = \int [M^K(x_1) + M^A(x_1)][M^{K^*}(x_2) + M^{A^*}(x_2)]$$
$$W(x - x_1, x - x_2) dx_1 dx_2$$
$$= \int [M^K(x_1) M^{K^*}(x_2) + M^A(x_1) M^{K^*}(x_2) + M^K(x_1) M^{A^*}(x_2) + M^A(x_1) M^{A^*}(x_2)] W(x - x_1, x - x_2) dx_1 dx_2$$
$$= I^T(x) + \int [M^A(x_1) M^{K^*}(x_2) + M^K(x_1) M^{A^*}(x_2) + M^A(x_1) M^{A^*}(x_2)] W(x - x_1, x - x_2) dx_1 dx_2$$

where W(x,y) is the space domain representation of TCC and $I^T(x)$ is the AI intensity without SRAF.

To derive the SGM expression, a unit source at x' in the SRAF portion of the mask layout is assumed, i.e., $M^A(x) = \delta(x - x')$. This unit source at x' contributes the following amount to the image slope at x:

$$\frac{dI(x)}{dx} - \frac{dI^T(x)}{dx} = \frac{d}{dx} \int [M^A(x_1) M^{K^*}(x_2) + M^K(x_1) M^{A^*}(x_2) + M^A(x_1) M^{A^*}(x_2)] W(x - x_1, x - x_2) dx_1 dx_2$$
$$= \frac{d}{dx} \int [\delta(x_1 - x') M^{K^*}(x_2) + M^K(x_1) \delta(x - x_2) + \delta(x - x_1) \delta(x - x_2)] W(x - x_1, x - x_2) dx_1 dx_2$$
$$= \frac{d}{dx} \int [W(x - x', x - x_1) M^{K^*}(x_1) + M^K(x_1) W(x - x_1, x - x')] dx_1 dx_2 + \frac{d}{dx} W(x - x', x - x')$$

The weighting of the vote from field point x to source point x' is equal to the gradient of the pre-OPC image, $$\frac{dM^R(x)}{dx} = \frac{1}{2} \frac{d}{dx} [M^T(x) + M^{T^*}(x)]$$

So the SGM value at x' is equal to $$V(x') = \int \frac{dM^R(x)}{dx} \frac{d(I(x) - I^T(x))}{dx} dx$$

-continued
$$= \int \frac{dM^R(x)}{dx} \frac{d}{dx} \left\{ \int [W(x - x', x - x_1) M^{K^*}(x_1) + M^K(x_1) W(x - x_1, x - x')] dx_1 \right\} dx + \int \frac{dM^R(x)}{dx} \frac{d}{dx} W(x - x', x - x') dx$$
$$= -\int M^R(x) \frac{d^2}{dx^2} \left\{ \int [W(x - x', x - x_1) M^{K^*}(x_1) + M^K(x_1) W(x - x_1, x - x')] dx_1 \right\} dx - \int M^R(x) \frac{d^2}{dx^2} W(x - x', x - x') dx$$

The last step in the above makes use of integration by parts. This expression does not reduce to the single-kernel SGM expression above even in the limit of coherent illumination because the single-kernel SGM essentially looks at the contribution to the gradient of the amplitude instead of the intensity.

Finally, with a change in variable names:

$$V(x) = -\int \left[ M^R(x_1) M^K(x_2) \frac{d^2}{dx_1^2} W(x_1 - x_2, x_1 - x) + M^R(x_1) M^{K^*}(x_2) \frac{d^2}{dx_1^2} W(x_1 - x, x_1 - x_2) \right] dx_1 dx_2 - \int M^R(x_1) \frac{d^2}{dx_1^2} W(x_1 - x, x_1 - x) dx_1$$
$$= -\int \left[ M^R(x - x_1) M^K(x - x_2) \frac{d^2}{dx_1^2} W(x_2 - x_1, -x_1) + M^R(x - x_1) M^{K^*}(x - x_2) \frac{d^2}{dx_1^2} W(-x_1, x_2 - x_1) \right] dx_1 dx_2 - \int M^R(x - x_1) \frac{d^2}{dx_1^2} W(-x_1, -x_1) dx_1$$

The Hermiticity of the SGM bilinear kernel is observed if $x_1$ is replaced by $X_2$ in the second term.

When $M^T$ is real and the OPC correction component ($M^C$) is ignored, then $M^R = M^K = M^{K^*} = M^T = M^{T^*}$ and the above formula resembles the Hopkins equation, which means the SGM may be computed using the standard kernel decomposition technique.

If $M^K$ is real and the OPC correction component ($M^C$) is not ignored, this is a bilinear integration involving two different input images (pre-OPC mask layout $M^R = M^T$ and post-OPC mask layout without SRAF $M^K = M^{K^*} = M^T + M^C$).

The SGM bilinear kernel (SGK) can be related to the TCC in the frequency domain. When $M^T$ is real and the OPC correction component ($M^C$) is ignored, $$SGK(k_1, k_2) = -\mathcal{F}\left[ \frac{d^2}{d\xi_1^2} W(\xi_2 - \xi_1, -\xi_1) + \frac{d^2}{d\xi_2^2} W(-\xi_2, \xi_2 - \xi_1) \right]$$
$$= -\int \left[ \frac{d^2}{d\xi_1^2} W(\xi_2 - \xi_1, -\xi_1) + \frac{d^2}{d\xi_2^2} W(-\xi_2, \xi_2 - \xi_1) \right] \exp(-ik_1 \xi_1 + ik_2 \xi_2) d\xi_1 d\xi_2$$

-continued $$= k_1^2 \int W(\xi_2 - \xi_1, -\xi_1)\exp(-ik_1\xi_1 + ik_2\xi_2)$$
$$d\xi_1 d\xi_2 + k_2^2 \int W(-\xi_2, \xi_2 - \xi_1)\exp(-ik_1\xi_1 + ik_2\xi_2)$$
$$d\xi_1 d\xi_2$$

$$= k_1^2 \int W(\xi_1', \xi_2')\exp(ik_1\xi_2' + ik_2(\xi_1' - \xi_2'))d\xi_1' d\xi_2' +$$
$$k_2^2 \int W(\xi_1', \xi_2')\exp(-ik_1(\xi_2' - \xi_1') - ik_2\xi_1')d\xi_1' d\xi_2'$$

$$= k_1^2 TCC(-k_2, k_1 - k_2) + k_2^2 TCC(-k_1 + k_2, -k_1)$$

The Hermiticity of the above is readily confirmed.

A practical difficulty is that if this formula is used directly, two raw TCCs appear simultaneously, which may be not feasible if the TCC is large (e.g., if each dimension of the TCC is 107 with float data type, then the total memory requirement exceeds 2G bytes). Therefore, it is desirable to make the computation "in-place." To do so, the SGM bilinear kernel can be decomposed as $$TCC_1(k_1,k_2)=TCC(-k_2,k_1)$$

$$TCC_2(k_1,k_2)=k_1^2 TCC_1(k_1-k_2,k_2)=k_1^2 TCC(-k_2,k_1-k_2)$$

$$SGK(k_1,k_2)=TCC_2(k_1,k_2)+TCC_2^*(k_2,k_1)$$

where each step is in-place.

Another practical consideration is that TCC is typically decomposed into convolution kernels, using an eigen-series expansion for computation speed and storage. Therefore, in step 510, a decomposed version of TCC is loaded, and then in step 512 the decomposed version of TCC is re-composed into a raw format. In steps 514-518, the SGM bilinear kernel (SGK($k_1$, $k_2$)) is computed in-place, and then in step 520 the SGM bilinear kernel is decomposed into eigenvalues and eigenvectors. In step 522, a partial SGM is computed using the mask layout, the decomposed SGM bilinear kernel, and existing fast bilinear operations. In the method of FIG. 5 it is assumed that $M^R=M^K=M^{K*}=M^T=M^{T*}$.

In steps 524 and 526, the SGM linear kernel is calculated. The spectrum of the SGM linear term kernel is expressed as:

$$SGK_{Linear}(k) = -\mathcal{F}\left[\frac{d^2}{d\xi^2}W(-\xi, -\xi)\right]$$
$$= -\int \left[\frac{d^2}{d\xi^2}W(-\xi, -\xi)\right]\exp(-ik\xi)d\xi$$
$$= k^2 \int W(-\xi, -\xi)\exp(-ik\xi)d\xi$$
$$= k^2 \mathcal{W}(-k)$$

where $\mathcal{W}(k)$ is the Fourier transform of $W(\xi,\xi)$.

$W(\xi_1,\xi_2)$ is also the inverse Fourier transform of $TCC(k_1, k_2)$. Thus, $$\mathcal{W}(k) = \frac{1}{2\pi}\int TCC(k_1, k-k_1)dk_1$$

This expression is for the continuous function analysis. However, when a DFT (Discrete Fourier Transform) is used in practice, the constant $2\pi$ should be replaced by the sequence length of the DFT. In step 528, another partial SGM is calculated by convolving the mask layout with the SGM linear kernel. In step 530, the partial SGMs are combined to produce the SGM. Note that steps 410-416 in FIG. 4 and steps 510-520 in FIG. 5 can be pre-executed for each optical model to improve run-time speed.

For an SRAF to optimize the process window, its placement should be optimized when the edge slope is the weakest. In general, edge slopes are lower at defocus, so the TCC at defocus and/or delta dose should be used to compute the SGM, so that the edge slope is maximized at those weakest PW points.

Different weights can be assigned to different target edge locations in the SGM computation, since different edge points may have different importance. For example, a higher weight can be assigned to the votes by poly-gate edge points, and a lower weight assigned to votes from large patterns and line ends. This weighting approach enables differential treatment for patterns of different importance for process window behavior. An additional consideration in assigning a weight to edge points is the edge's existing slope, such that a higher weight is given to those edge locations that have low edge slope since they are hot spots (i.e., weak points in the layout over process window variation). For this, OPC corrections without SRAFs can be applied to a mask layout, the aerial image computed, and then the aerial image's edge slope at each edge location computed. The inverse of ILS (image log slope) for an edge location can be used as that edge location's weight. These two weighting approaches, i.e., a feature importance-based weight and an ILS-based weight, can also be combined to give a combined weight. Other possible weighting schemes are within the scope of the invention.

To apply weighting in the SGM computation, the relative importance of each edge evaluation point is identified based on, e.g., gate vs. non-gate, line vs. corner, line width, etc. A non-negative weight is then assigned to each edge evaluation point. For example, a weight of 1 is nominal, any value above 1 is additional weight (so, weight 2.0 means the edge point's vote is twice important as nominal-weighted points), any value below 1 is lower weight (i.e., weight 0 means the edge point's vote should not be counted at all and weight 0.5 means the edge point's vote is counted as 50% of nominal-weighted points), and a weight never goes below 0.0. Next, a weight image $Wm(xy)$ is rendered at the same pixel grid of the pre-OPC layout $M(x,y)$, assuming each weight is a delta function at the edge point location (x,y), and a low-pass filter is applied to the weight image to match the pass-band of the pre-OPC layout's sampling frequency. The final weight map image is multiplied with the gradient of the pre-OPC layout $M(x,y)$ and the result is used as the weighted target image in computing the SGM.

For the single-kernel SGM, the vote map is changed to $$V(x, y) = \sum_{(x',y')} [Wm(x', y')G_x(x', y')D_x(x'-x, y'-y) +$$
$$Wm(x', y')G_y(x', y')D_y(x'-x', y'-y)]$$
$$= [Wm(x, y)G_x(x, y)] \otimes D_x(-x, -y) - [Wm(x, y)G_y(x, y)] \otimes$$
$$D_y(-x, -y)$$
$$= -IFFT(FFT(WmG_x) * IFFT(D_x) + FFT(WmG_y) *$$

-continued $$IFFT(D_y))$$
$$= -iIFFT((f_x FFT(WmG_x) + f_y FFT(WmG_y) * IFFT(F))$$

For the multi-kernel SGM, the vote map is changed to $$V(x') = \int Wm(x) \frac{dM^R(x)}{dx} \frac{d(I(x) - I^T(x))}{dx} dx$$

$$= \int Wm(x) \frac{dM^R(x)}{dx} \frac{d}{dx}$$

$$\left\{ \int [W(x - x', x - x_1) M^{K*}(x_1) + M^K(x_1) \right.$$

$$\left. W(x - x_1, x - x')] dx_1 \right\} dx + \int Wm(x) \frac{dM^R(x)}{dx} \frac{d}{dx}$$

$$W(x - x', x - x') dx$$

$$= -\int Wm(x) M^R(x) \frac{d^2}{dx^2}$$

$$\left\{ \int [W(x - x', x - x_1) M^{K*}(x_1) + M^K(x_1) W(x - x_1, x - x')] dx_1 \right\} dx$$

$$- \int Wm(x) M^R(x) \frac{d^2}{dx^2} W(x - x', x - x') dx - \int Wm'(x)$$

$$M^R(x) \frac{d}{dx} \left\{ \int [W(x - x', x - x_1) M^{K*}(x_1) + M^K(x_1) W \right.$$

$$(x - x_1, x - x')] dx_1 \right\} dx - \int Wm'(x) M^R(x) \frac{d}{dx} W$$

$$(x - x', x - x') dx$$

Again, with a change in variables, $$V(x) = -\int \left[ Wm(x_1) M^R(x_1) M^K(x_2) \frac{d^2}{dx_1^2} W(x_1 - x_2, x_1 - x) + \right.$$

$$\left. Wm(x_1) M^R(x_1) M^{K*}(x_2) \frac{d^2}{dx_1^2} W(x_1 - x, x_1 - x_2) \right] dx_1 dx_2 -$$

$$\int Wm'(x_1) M^R(x_1) \frac{d^2}{dx_1^2} W(x_1 - x, x_1 - x) dx_1 - \int$$

$$\left[ Wm'(x_1) M^R(x_1) M^K(x_2) \frac{d}{dx_1} W(x_1 - x_2, x_1 - x) + Wm' \right.$$

$$\left. (x_1) M^R(x_1) M^{K*}(x_2) \frac{d}{dx_1} W(x_1 - x, x_1 - x_2) \right] dx_1 dx_2 -$$

$$\int Wm'(x_1) M^R(x_1) \frac{d}{dx_1} W(x_1 - x, x_1 - x) dx_1$$

$$= -\int \left[ Wm(x - x_1) M^R(x - x_1) M^K(x - x_2) \frac{d^2}{dx_1^2} W \right.$$

$$(x_2 - x_1, -x_1) + Wm(x - x_1) M^R(x - x_1) M^{K*}(x - x_2)$$

$$\frac{d^2}{dx_1^2} W(-x_1, x_2 - x_1) \right] dx_1 dx_2 - \int Wm(x - x_1) M^R(x - x_1)$$

$$\frac{d^2}{dx_1^2} W(-x_1, -x_1) dx_1 + \int [Wm'(x - x_1) M^R(x - x_1) M^K$$

$$(x - x_2) \frac{d}{dx_1} W(x_2 - x_1, -x_1) + Wm'(x - x_1)$$

$$M^R(x - x_1) M^{K*}(x - x_2)$$

-continued $$\frac{d}{dx_1} W(-x_1, x_2 - x_1) \right] dx_1 dx_2 + \int Wm'(x - x_1) M^R(x - x_1)$$

$$\frac{d}{dx_1} W(-x_1, -x_1) dx_1$$

The first three integrations resemble the unweighted SGM with the same kernels. The only difference is that the mask image $M^R$ is replaced by $WmM^R$. When $M^T$ is real and the OPC correction ($M^C$) is ignored, the kernel for the fourth and fifth integrations is $$SGK^W(k_1, k_2) = \mathcal{F} \left[ \frac{d}{d\xi_1} W(\xi_2 - \xi_1, -\xi_1) + \frac{d^2}{d\xi_2} W(-\xi_2, \xi_1 - \xi_2) \right]$$

$$= \int \left[ \frac{d}{d\xi_1} W(\xi_2 - \xi_1, -\xi_1) + \frac{d}{d\xi_2} W(-\xi_2, \xi_1 - \xi_2) \right]$$

$$\exp(-ik_1\xi_1 + ik_2\xi_2) d\xi_1 d\xi_2$$

$$= ik_1 \int W(\xi_2 - \xi_1, -\xi_1) \exp(-ik_1\xi_1 + ik_2\xi_2) d\xi_1 d\xi_2 -$$

$$ik_2 \int W(-\xi_2, \xi_1 - \xi_2) \exp(-ik_1\xi_1 + ik_2\xi_2) d\xi_1 d\xi_2$$

$$= ik_1 \int W(\xi_1', \xi_2') \exp(ik_1\xi_2' + ik_2(\xi_1' - \xi_2'))$$

$$d\xi_1' d\xi_2' - ik_2 \int W(\xi_1', \xi_2') \exp(-ik_1(\xi_2' - \xi_1') -$$

$$ik_2\xi_1') d\xi_1' d\xi_2'$$

$$= ik_1 TCC(-k_2, k_1 - k_2) - ik_2 TCC(-k_1 + k_2, -k_1)$$

The kernel for the last integration becomes $$SGK^W_{Linear}(k) = \mathcal{F} \left[ \frac{d^2}{d\xi^2} W(-\xi, -\xi) \right]$$

$$= \int \left[ \frac{d^2}{d\xi^2} W(-\xi, -\xi) \right] \exp(-ik\xi) d\xi$$

$$= -ik \int W(-\xi, -\xi) \exp(-ik\xi) d\xi$$

$$= -ikW(-k)$$

where $\mathcal{W}(k)$ is defined previously.

In one embodiment, the SGM is used to create a set of SRAF placement rules. An example of a set of SRAF placement rules is shown below in Table 1. Column 1 identifies the type of pattern, where type 1 is an SRAF-favored pattern like a gate, and type 2 is an SRAF-non-favored pattern like a metal line. Column 2 identifies the space between the main features in the layout. There are three kinds of SRAF placement rules shown in Table 1. The first kind of rule (columns 3-6) is for placing SRAFs (i.e., scattering bars or SB) between the same type of patterns. The second kind of rule (columns 7-10) is for placing SRAFs between an SRAF-favored pattern and an SRAF-non-favored pattern. The third kind of rule (columns 11-14) is for placing SRAFs between an SRAF-favored or SRAF-non-favored pattern and a no-SRAF pattern (e.g., very large patterns). For contact layers, all three of kinds of rules are the same.

Each row of Table 1 specifies the number of SRAFs to be placed, the width of each SRAF, the space between the SRAF and the main feature, and the space between the SRAFs according to the space between the main features. For poly (metal) layer, the SRAF placement rules are created using the SGM and a series of one-dimensional test features.

TABLE 1

| Type | Space | SB # | SB width | SP1 | SP2 | Cp # | cpSB width | cpSP1 | cpSP2 | Cp2 # | cp2AF width | cp2SP1 | cp2SP2 |
|---|---|---|---|---|---|---|---|---|---|---|---|---|---|
| 1 | 330 | 1 | 40 | 0 | 0 | 0 | 0 | 0 | 0 | 0 | 0 | 0 | 0 |
| 1 | 500 | 2 | 40 | 145 | 0 | 0 | 0 | 0 | 0 | 2 | 40 | 145 | 120 |
| 1 | 650 | 3 | 40 | 145 | 0 | 0 | 0 | 0 | 0 | 2 | 40 | 145 | 120 |
| 1 | 820 | 4 | 40 | 145 | 120 | 0 | 0 | 0 | 0 | 0 | 0 | 0 | 0 |
| 2 | 330 | 1 | 40 | 0 | 0 | 0 | 0 | 0 | 0 | 0 | 0 | 0 | 0 |
| 2 | 500 | 2 | 40 | 145 | 0 | 0 | 0 | 0 | 0 | 2 | 40 | 145 | 120 |
| 2 | 650 | 3 | 40 | 145 | 0 | 0 | 0 | 0 | 0 | 2 | 40 | 145 | 120 |
| 2 | 820 | 4 | 40 | 145 | 120 | 0 | 0 | 0 | 0 | 0 | 0 | 0 | 0 |

Figure 6A:
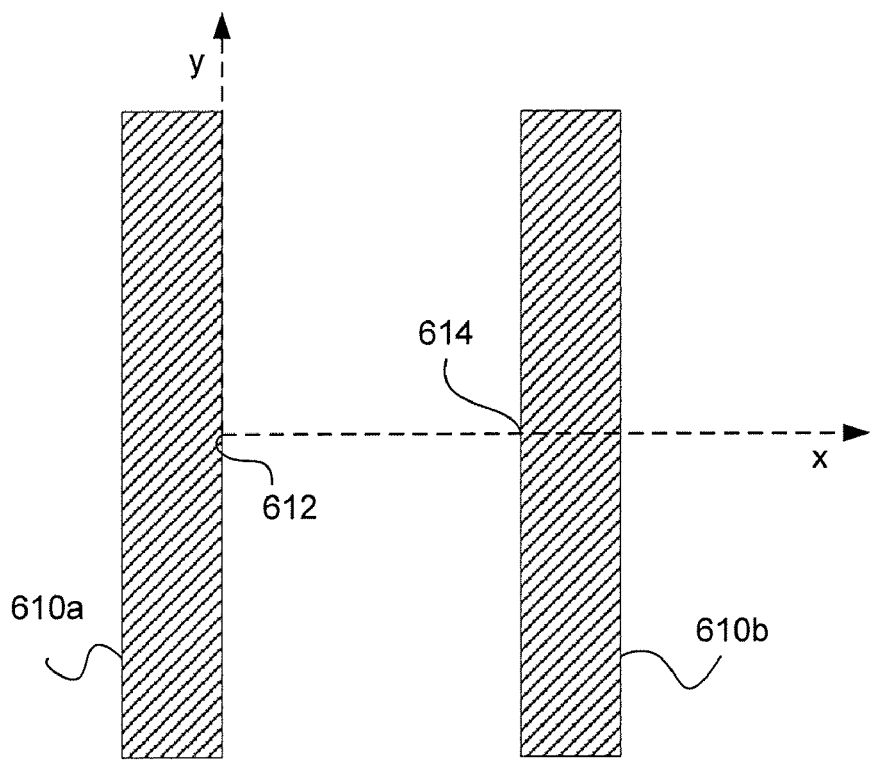
FIG. 6A is a diagram of one embodiment of test features and a coordinate system for generating SRAF placement rules using an SGM, according to the invention.

FIG. 6A is a diagram of one embodiment of test features and a coordinate system for generating SRAF placement rules for poly (metal) layer using an SGM, according to the invention. For a specified space between main features, a test pattern composed of repetitive line test features is created, in which both the line test features and SRAFs are assumed to have infinite length as compared to their width. FIG. 6A shows two line test features 610a and 610b that are of the same type, e.g., both features are gates. Thus the following discussion describes generating the first kind of SRAF placement rules. The width of the line test features equals the most important line width of the layout and the space between any two neighboring line test features is the specified space value between main features. An SGM is then generated for this test pattern.

As shown in FIG. 6A, a coordinate system is imposed on the test patterns, where the y-axis coincides with the boundary of an arbitrary line test feature and the x-axis is perpendicular to the line test features. In FIG. 6A, x=0 (612) and x=space (614) correspond to the boundaries of neighboring line test features 610a and 610b. For the one-dimensional rule, the SGM value between any two neighboring line patterns S(x) is equal to SGM (x,0) and x=[0, 1, ... space]. The SRAF placement rule generation problem for these line test features is then transformed into the problem of partitioning the interval [0, space] into n smaller intervals $[x_{1s}, x_{1e}]$, $[x_{2s}, x_{2e}]$, ... $[x_{ns}, x_{ne}]$, where $0 \leq x_{1s} < x_{1e} < x_{2e} < \ldots < x_{ns} < x_{ne} \leq space$. Each interval represents an SRAF, i.e., the i-th SRAF ($1 \leq i \leq n$) can be described as $x_{is} \leq x \leq x_{ie}$.

Determining the optimal SRAF placement rule is equivalent to maximizing the total SGM value covered by SRAFs subject to MRC rules and SRAF printability constraints. Let $S_i$ be the SGM value covered by the i-th SRAF ($1 \leq i \leq n$), then the total SGM value covered by SRAFs is $$\sum_{i=1}^{n} S_i = \sum_{i=1}^{n} \sum_{x=x_{is}}^{x_{ie}} S(x)$$

There are five constraints on placing SRAFs in a layout:
1. minimum SRAF width ($W_{min}$), i.e., for any $i \in \{1, 2, \ldots, n\}$, $x_{ie} - x_{is} \geq W_{min}$
2. maximum SRAF width ($W_{max}$), i.e., for any $i \in \{1, 2, \ldots, n\}$, $x_{ie} - x_{is} \leq W_{max}$
3. minimum spacing between SRAF and main feature ($S_{main}$), i.e., $x_{1s} \geq S_{main}$ and $x_{ne} \leq space - S_{main}$
4. minimum spacing between any two neighboring SRAFs ($S_{SRAF}$), i.e., for any $i \in \{2, \ldots, n\}$, $x_{is} - x_{(i-1)e} \geq S_{SRAF}$
5. For any $i \in \{1, 2, \ldots, n\}$, $S_i \geq 0$ (There is no need to place SRAFs with negative SGM value, even if its value is the largest possible).

Assuming the global optimal solution (partition) for [0,space] with constraints ($W_{min}$, $W_{max}$, $S_{main}$, $S_{SRAF}$) is $Rule_{opt} = \{[x_{1s}, x_{1e}], [x_{2s}, x_{2e}], \ldots, [x_{ns}, x_{ne}]\}$, then the i-th SRAF ($1 \leq i \leq n$) covers $[x_{is}, x_{ie}]$. What is more, for any $i \in \{2, \ldots, n\}$, $\{[x_{1s}, x_{1e}], [x_{2s}, x_{2e}], \ldots [x_{(i-1)s}, x_{(i-1)e}]\}$ is also the optimal partition for $[0, x_{is} - S_{SRAF}]$ with the same constraints (otherwise, if there exists a better partition for $[0, x_{is} - S_{SRAF}]$, then it can be combined with the i, i+1, ..., n-th SRAF placement in $Rule_{opt}$ and land at a rule that is better than $Rule_{opt}$ and still satisfies the constraints, which contradicts the optimality of $Rule_{opt}$).

Thus, the interval [0,space] is divided into smaller intervals and an algorithm is constructed based on dynamic programming. The summary of this algorithm follows, assuming $space \geq 2S_{main} + W_{min}$:

INPUT: space, S(x) for x=[0, 1, ..., space], and constraints ($W_{min}$, $W_{max}$, $S_{main}$, $S_{SRAF}$)

Intermediate Results:
NumSRAFArray[x] (x=[0, 1, ..., space-$S_{main}$]): an array which has a size of space-$S_{main}$+1 and NumSRAFArray[x] stores the number of SRAFs of the optimal partition for [0,x]

SRAFSGMArray[x] (x[0, 1, ..., space-$S_{main}$]): an array which has a size of space-$S_{main}$+1 and SRAFSGMArray[x] stores the total SGM covered by SRAFs of the optimal partition for [0,x]

SRAFLeftEndArray[x] (x=[0, 1, ..., space-$S_{main}$]): an array which has a size of space-$S_{main}$+1 and SRAFLeftEndArray[x] stores the coordinate of the right most SRAF's left end of the optimal partition for [0,x] (corresponds to the largest $x_{is}$ such that $x_{ie} \leq x$)

SRAFRightEndArray[x] (x=[0, 1, ..., space-$S_{main}$]): an array which has a size of space-$S_{main}$-1 and SRAFLeftEndArray[x] stores the coordinate of the right most SRAF's right end of the optimal partition for [0,x] (corresponds to the largest $x_{ie}$ such that $x_{ie} \leq x$)

Initialization:
Set NumSRAFArray[x] and SRAFSGMArray[x] to zero for all x=[0, 1, ..., space-$S_{main}$]

SRAF Computation:

```
For i=S_main+W_min to space-S_main, STEP=1         //For Constraint 3
    tempSGMValue←SRAFSGMArray[i-1]
    tempNumSRAF←NumSRAFArray[i-1]
    tempSRAFLeftEnd←SRAFLeftEndArray[i-1]
    tempSRAFRightEnd←SRAFRightEndArray[i-1]

tempNewSRAFSGM ← ∑(k=i-W_min to i) S(k)        //Candidate SRAF's SGM value for j=i-W_min to max {i-W_max, S_main}: STEP=-1
    //j: Candidate SRAF's left end.
    //The width of each SRAF is guaranteed to fall in [W_min, W_max]
        if(tempNewSRAFSGM≧0)                       //For Constraint 5
            h←j-S_SRAF
            if(h≧S_main+W_min)
                PreviousSGMValue←SRAFSGMArray[h]
                PreviousNumSRAF←NumSRAFArray[h]
                //Optimal partition for [0,j-S_SRAF]
            else
                PreviousSGMValue←0
                PreviousNumSRAF←0
            End
            if(tempNewSRAFSGM+PreviousSGMValue>tempSGMValue)
                tempSGMValue←
                    tempNewSRAFSGM+PreviousSGMValue
                tempNumSRAF←PreviousNumSRAF+1
                tempSRAFLeftEnd←j
                tempSRAFRightEnd←i
            End
        End
        tempNewSRAFSGM←tempNewSRAFSGM+S(j-1)
    End
    SRAFSGMArray[i]←tempSGMValue
    NumSRAFArray[i]←tempNumSRAF
    SRAFLeftEndArray[i]←tempSRAFLeftEnd
    SRAFRightEndArray[i]←tempSRAFRightEnd         //Update all intermediate results
End
```

OUTPUT: NumSRAFArray[space-$S_{SRAF}$], SRAFLeftEndArray[x] (x=[0, 1, ..., space-$S_{SRAF}$]), and SRAFRightEndArray[x] (x=[0, 1, ..., space-$S_{SRAF}$])

Figure 6B:
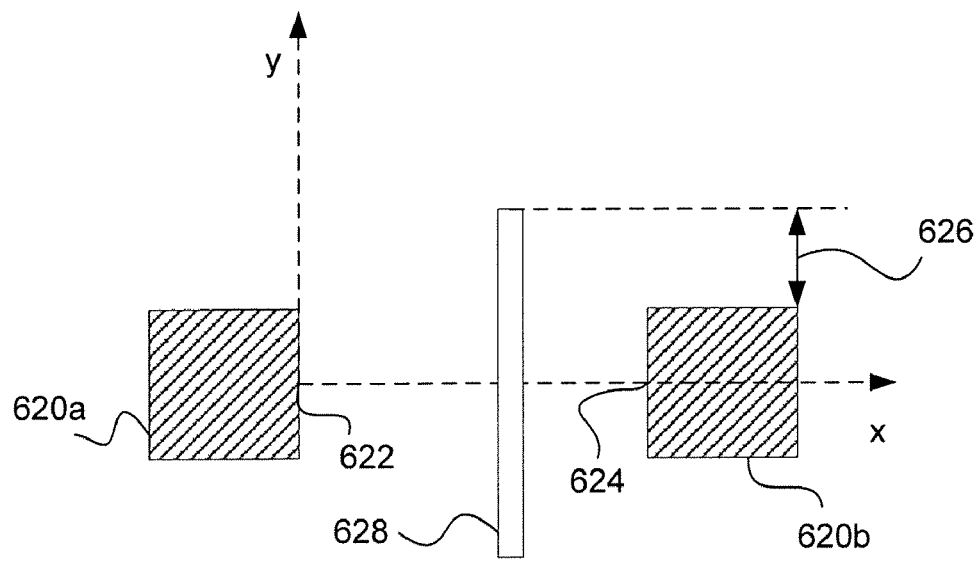
FIG. 6B is a diagram of one embodiment of test contact features and a coordinate system for generating SRAF placement rules using an SGM, according to the invention.

FIG. 6B is a diagram of one embodiment of contact test features and a coordinate system for generating SRAF placement rules using an SGM, according to the invention. The contact test features 620a and 620b are repetitive square features. Since the significance of each contact test feature 620a, 620b is identical, the following discussion describes generating the first kind of SRAF placement rules. The space between any two neighboring contacts is the specified space between main features. An SGM is generated for this test pattern. A coordinate system is imposed on the contact test features, where the y-axis coincides with the boundary of an arbitrary contact test feature, the origin is located at the middle of that edge of the contact test feature. In FIG. 6B, x=0 (622) and x=space (624) correspond to the boundaries of neighboring contact test features 620a and 620b.

For a contact layer, the length of a main feature is typically the same as the width, thus two-dimensional effects caused by the finite length of the feature are considered. For SRAFs placed in a contact layer, the SRAF length is specified by a parameter "sbEndExtension" 626. If the length of contact test features 620a, 620b is L, then the length of an SRAF 628 is L+2*sbEndExtension. Since only the SGM value covered by SRAFs is of interest, the SGM value function S(x) is redefined as:

$$S(x) = \sum_{y=-L/2-sbEndExtension}^{L/2+sbEndExtension} SGM(x, y) \text{ for } x = [0, 1, \ldots, space]$$

Determining the first type of SRAF placement rules for contacts is the same as described above for line features, except for the different definition of S(x).

Determining the second kind of SRAF placement rules (i.e., rules for placing SRAFs between SRAF-favored patterns and SRAF-non-favored patterns) is similar to determining the first kind of SRAF placement rules except that different weights are assigned to neighboring patterns. For example, an edge of an SRAF-favored pattern will be assigned a higher weight than an edge of an SRAF-non-favored pattern.

Figure 6C:
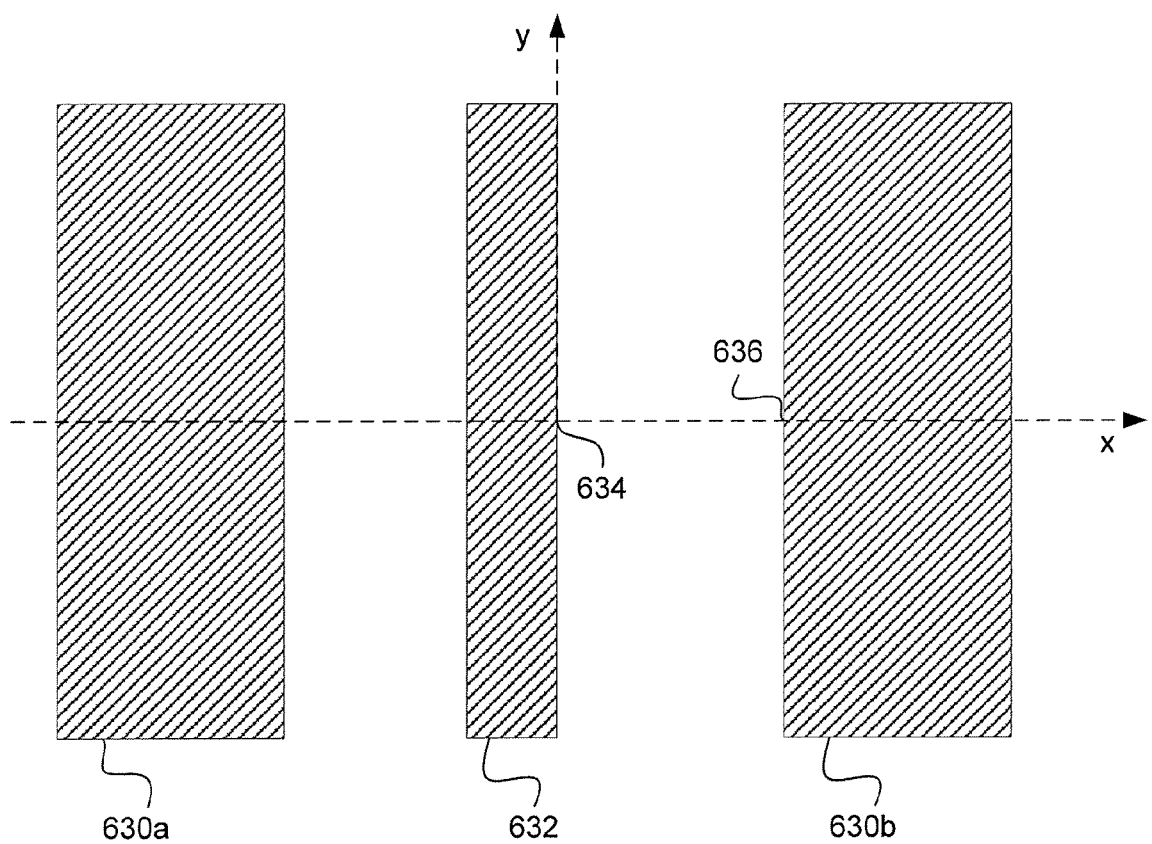
FIG. 6C is a diagram of one embodiment of test features and a coordinate system for generating SRAF placement rules using an SGM, according to the invention.

FIG. 6C is a diagram of one embodiment of test features and a coordinate system for generating SRAF placement rules using an SGM, according to the invention. The test features of FIG. 6C are used to determine the third kind of SRAF placement rules (i.e., rules for placing SRAFs between an SRAF-favored feature or SRAF-non-favored feature and a no-SRAF feature). A central line test feature 632 has width of the most important line width in the design layout and line test features 630a and 630b (no-SRAF features) are assumed to be infinitely wide. The SRAF placement rules are determined as described above in conjunction with FIG. 6A, except that line test feature 632 is assigned a large weight, and line test features 630a, 630b are assigned a very small weight.

After SRAFs are placed according to the placement rules, the placement, width, and length of each SRAF can be fine-tuned using the SGM to account for the 2D effects of the mask layout. For poly (metal) layer, the SRAF placement rule is generated with the assumption that the main features' length is much larger than their width. However, this assumption is not always valid. For example, for areas near line-ends, the SGM may indicate that a placed SRAF should be slightly wider than the width dictated by the rule. This SRAF may then be thickened. The SGM value covered by each SRAF can also be used as the SRAF's priority to resolve potential conflicts. For example, if SRAFs from different main feature segments overlap, the SRAF with lower priority is modified first to remove the overlap.

Figure 7:
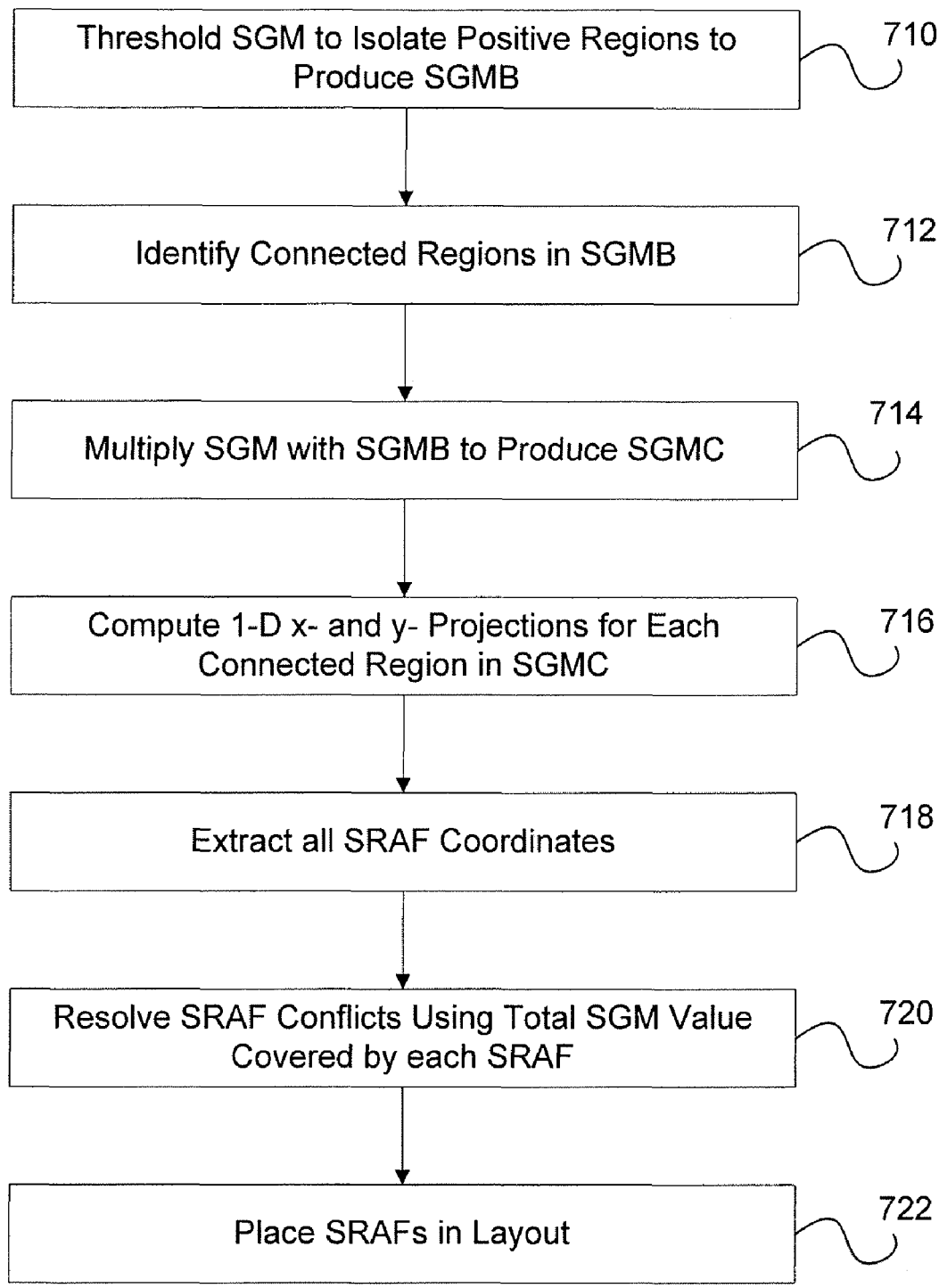
FIG. 7 is a flowchart of method steps for rule-free placement of SRAFs using an SGM, according to one embodiment of the invention.

FIG. 7 is a flowchart of method steps for rule-free placement of SRAFs using an SGM, according to one embodiment of the invention. In the FIG. 7 embodiment, SRAFs are derived directly from the SGM, instead of first generating SRAF placement rules. In this embodiment, regions of the SGM are converted into SRAF polygons. Each SRAF polygon is required to be a thin bar shape, to be oriented either horizontally or vertically, and to have a width within the range [$W_{min}$, $W_{max}$].

In step 710, the SGM is thresholded to identify the positive regions, i.e., the regions where SRAFs are desired. The thresholding produces a binary image, SGMB. In step 712, standard image processing methods are used to identify connected positive regions within the SGMB. In step 714, the SBM is multiplied by the SGMB to produce SGMC, such that each positive pixel of the SGMB is assigned its corresponding value in the SGM. In step 716, one-dimensional x- and y-projections of the SGMC are computed for each connected region. In step 718, all of the SRAF coordinates (i.e., locations where all SRAFs should be placed) are extracted by applying the above-described dynamic programming approach for rule generation to the one-dimensional projections. In step 720, any conflicts between placing SRAFs are resolved using the total SGM value covered by each SRAF as its priority. Possible conflicts between placing SRAFs include the minimum allowed end-to-end distance between SRAFs and the minimum allowed corner-to-corner distance between SRAFs. In step 722, the SRAFs are placed in the layout.

Figure 8:
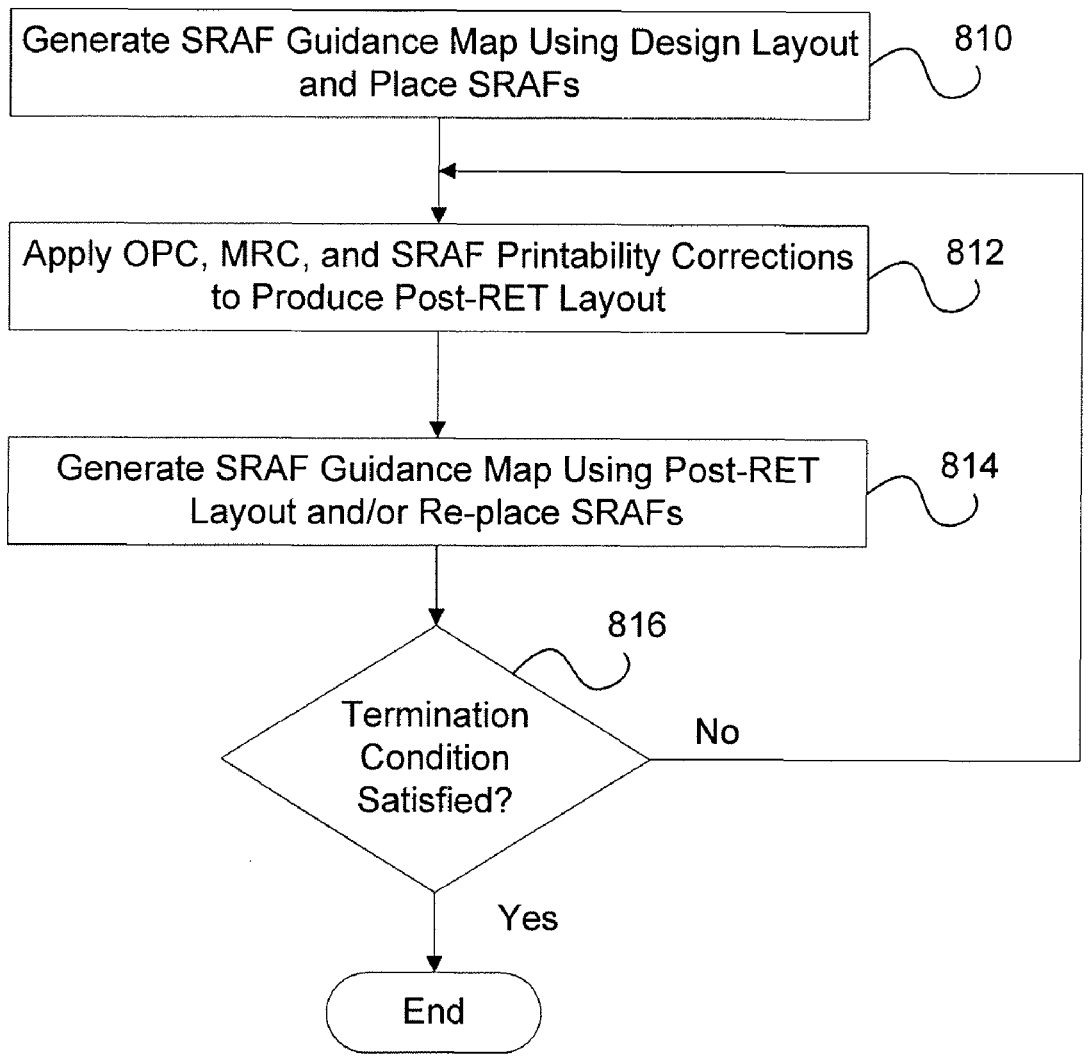
FIG. 8 is a flowchart of method steps for integrating model-based SRAF generation with applying OPC corrections, according to one embodiment of the invention.

FIG. 8 is a flowchart of method steps for integrating model-based SRAF generation with applying OPC corrections, according to one embodiment of the invention. Typically, OPC correction image data ($M^C$) is quite small compared to the pre-OPC mask image data ($M^T$), so the post-OPC mask image $M^K(x)=M^T(x)+M^C(x) \approx M^T(x)$ and the SGM only depends on the pre-OPC layout. Thus the SGM can be generated and SRAFs placed in the layout before OPC corrections are applied. However, if the OPC corrections cannot be ignored, the SGM generation and SRAF placement can be integrated with the application of OPC corrections.

In step 810, the SGM is first generated using the design (pre-OPC) layout and SRAFs are placed in the design layout using either placement rules generated using the SGM or directly from the SGM, as described above. In step 812, OPC, mask rule check (MRC), and SRAF printability corrections are applied to the design layout with the SRAFs. In step 814, a new SGM is generated using the post-OPC layout and/or the SRAFs are re-placed in the post-OPC layout. Regenerating the SGM in step 814 is optional. In step 816, if the termination condition is satisfied, the method ends, but if the termination condition is not satisfied, the method returns to step 812 where another iteration of the OPC, MRC, and SRAF printability corrections is applied. The termination condition can be a maximum iteration number or a determination of whether a simulated resist image contour is sufficiently close to the design target.

Adjusting the placement of SRAFs after each iteration of OPC and other corrections can be quite efficient. For example, after one iteration of OPC corrections, certain SRAFs may not be placed in accordance with the SGM because of MRC constraints such not being as wide as desired or not being able to be placed at all. However, after another iteration of OPC corrections, there may be room for these SRAFs to be placed.

Figure 9:
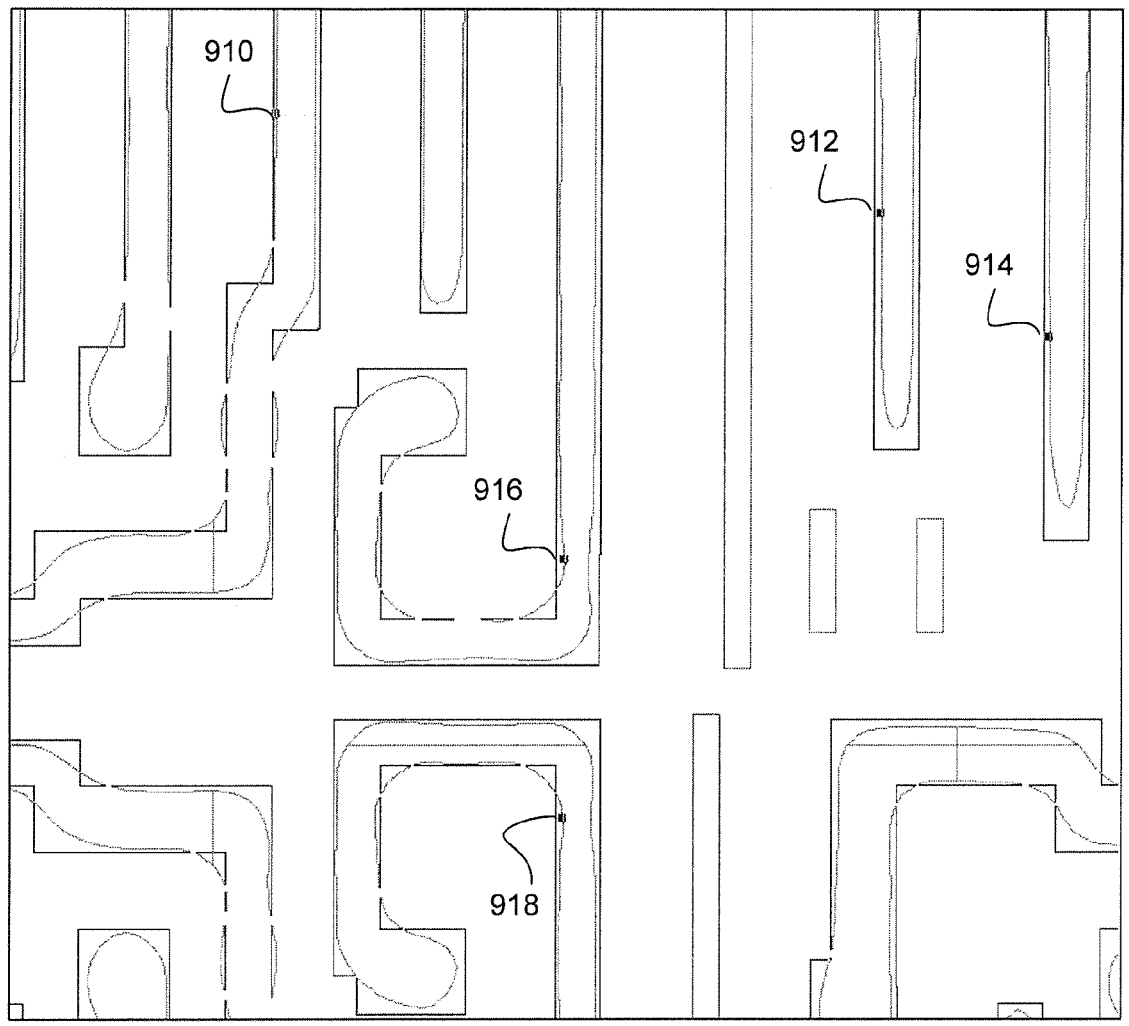
FIG. 9 is a diagram showing critical dimensions of features in a layout after application of a prior art SRAF placement rule.

FIG. 9 is a diagram showing a design target layout with SRAFs that were placed according to prior art SRAF placement rules. FIG. 9 also shows simulated resist contours for the post-OPC layout. The critical dimension (i.e., linewidth) measured at hot spot 910 is 49.6 nm, at hot spot 912 the critical dimension is 40 nm, at hot spot 914 the critical dimension is 44 nm, at hot spot 916 the critical dimension is 29.3 nm, and at hot spot 918 the critical dimension is 35.5 nm. Hot spot 916 especially shows what is known as "necking," where the simulated resist contour is much narrower than the designed-for linewidth.

Figure 10:
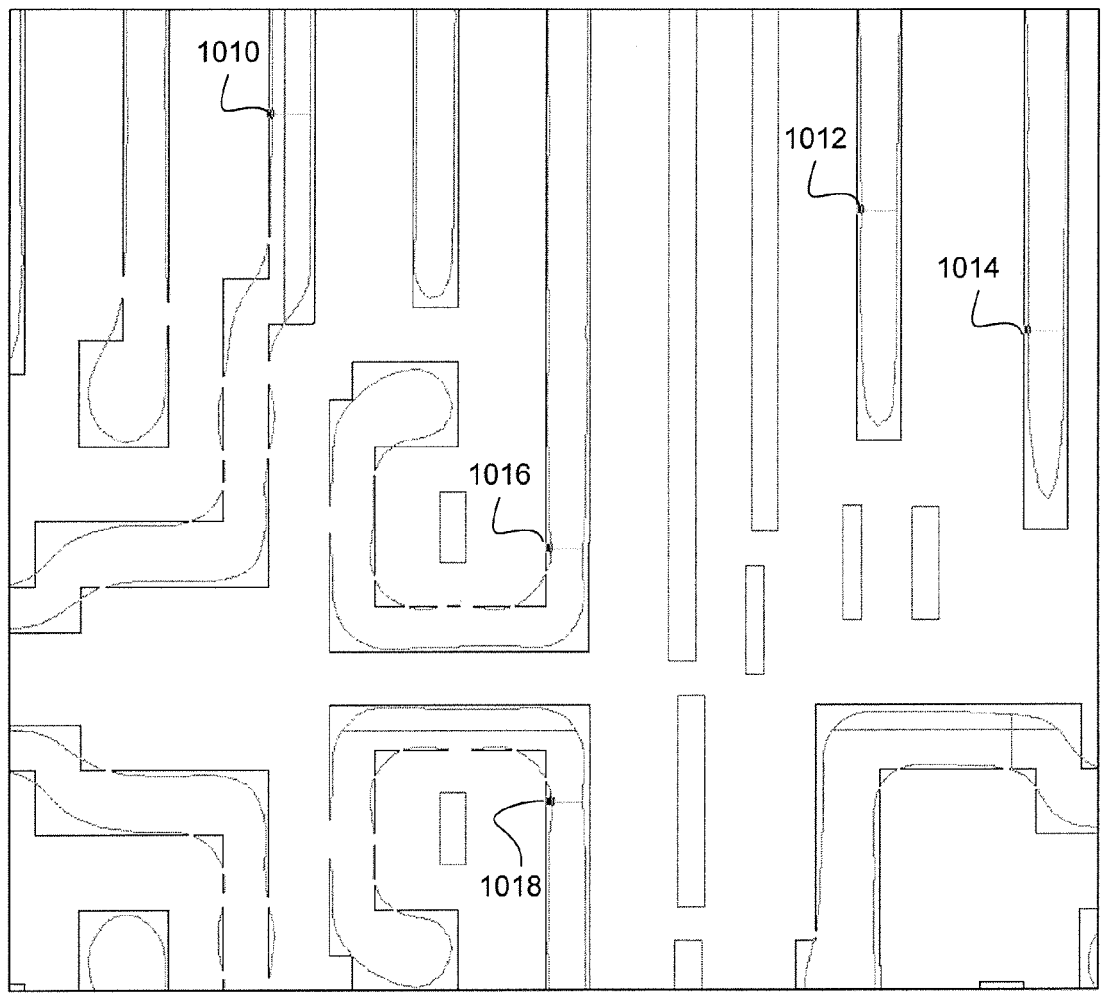
FIG. 10 is a diagram showing critical dimensions of features in a layout after application of SRAF placement rules created using an SGM, according to one embodiment of the invention.

FIG. 10 is a diagram showing the same design target layout with SRAFs that were placed according to SRAF placement rules created using an SGM. FIG. 10 also shows simulated resist contours for this post-OPC layout. The critical dimension measured at hot spot 1010 is 49.77 nm, at hot spot 1012 the critical dimension is 47.44 nm, at hot spot 1014 the critical dimension is 44.75 nm, at hot spot 1016 the critical dimension is 41.24 nm, and at hot spot 1018 the critical dimension is 40.72 nm. As seen in comparing the measured critical dimensions in FIG. 9 and FIG. 10, the post-OPC layout having SRAFs placed using the SGM results in simulated resist contours that better match the layout and improved critical dimensions at hot spots.

The SGM may be used in other applications other than placing SRAFs. The SGM may be used to identify hot spots in the pre-OPC (design target) layout. If a main feature resides in an area that has a very low SGM value computed without this feature, the feature will adversely affect the process window of the edges of neighboring patterns and the overall process window robustness of the design. The SGM may also be used to repair hot spots by shifting the hot spots to an area with a higher SGM value. The SGM may be used in a double exposure design, where the full chip design is separated into two groups of patterns that are exposed in sequence. In separating all the patterns into two groups, some patterns are ambiguous, i.e., the pattern does not violate any rule if it is placed in either group. For such patterns, the SGM may be used to decide in which group the pattern should be placed by selecting the layout with the higher SGM value. The SGM may also be used to determine overall bias rules for a layout, i.e., how much a pattern should enlarge or shrink.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A computer-implemented method for placing sub-resolution assist features (SRAFs) in a mask layout, comprising: obtaining the mask layout;

generating, by the computer, an SRAF guidance map from the mask layout, wherein the SRAF guidance map is an image having a plurality of pixels corresponding to the mask layout, and wherein the generating step includes computing, for each pixel in the image, whether a sub-resolution assist feature located in the mask layout corresponding to the pixel would contribute positively to edge behavior of features in the mask layout;

placing sub-resolution assist features in the mask layout according to the SRAF guidance map; and applying optical proximity correction including the SRAFs to produce an updated mask layout.

2. The method of claim 1, wherein generating an SRAF guidance map comprises:

computing an image gradient map of the mask layout;

for each field point in the mask layout, computing a total vote sum for a unit source at the field point using the image gradient map; and assigning values in the SRAF guidance map, wherein the value at a pixel in the SRAF guidance map is the total vote sum at a corresponding field point in the mask layout.

3. The method of claim 2, wherein computing a total vote sum for a unit source at the field point is performed in the frequency domain and includes:

computing the inverse Fourier Transform of a most significant eigenvector of transmission cross coefficients that represent the optical path of an exposure tool;

computing the Fourier Transform of the mask layout;

multiplying the inverse Fourier Transform by the sum square of frequency and the Fourier Transform of the mask layout to produce a product; and computing the inverse Fourier Transform of the product to produce the SRAF guidance map.

4. The method of claim 1, wherein generating an SRAF guidance map comprises:

computing a bilinear SRAF guidance map kernel using the transmission crosscoefficients that represent the optical path of an exposure tool;

computing a linear SRAF guidance map kernel using the transmission cross-coefficients; computing a partial SRAF guidance map using the bilinear SRAF guidance map kernel and the mask layout;

computing a second partial SRAF guidance map using the linear SRAF guidance map kernel and the mask layout; and combining the partial SRAF guidance map and the second partial SRAF guidance map.

5. The method of claim 1, further comprising generating SRAF placement rules using the SRAF guidance map.

6. A non-transitory computer-readable medium including instructions for performing: the following steps: obtaining a mask layout;

generating an SRAF guidance map from the mask layout, wherein the SRAF guidance map is an image having a plurality of pixels corresponding to the mask layout, and wherein the generating step includes computing, for each pixel in the image, whether a sub-resolution assist feature located in the mask layout corresponding to the pixel would contribute positively to edge behavior of features in the mask layout;

placing sub-resolution assist features in the mask layout according to the SRAF guidance map; and applying optical proximity correction including the SRAFs to produce an updated mask layout.

7. The computer-readable medium of claim 6, wherein generating an SRAF guidance map comprises:

computing an image gradient map of the mask layout;

for each field point in the mask layout, computing a total vote sum for a unit source at the field point using the image gradient map; and assigning values in the SRAF guidance map, wherein the value at a pixel in the SRAF guidance map is the total vote sum at a corresponding field point in the mask layout.

8. The computer-readable medium of claim 7, wherein computing a total vote sum for a unit source at the field point is performed in the frequency domain and includes:

computing the inverse Fourier Transform of a most significant eigenvector of transmission cross coefficients that represent the optical path of an exposure tool;

computing the Fourier Transform of the mask layout;

multiplying the inverse Fourier Transform by the sum square of frequency and the Fourier Transform of the mask layout to produce a product; and computing the inverse Fourier Transform of the product to produce the SRAF guidance map.

9. The computer-readable medium of claim 6, wherein generating an SRAF guidance map comprises:

computing a bilinear SRAF guidance map kernel using the transmission crosscoefficients that represent the optical path of an exposure tool;

computing a linear SRAF guidance map kernel using the transmission cross-coefficients;

computing a partial SRAF guidance map using the bilinear SRAF guidance map kernel and the mask layout;

computing a second partial SRAF guidance map using the linear SRAF guidance map kernel and the mask layout; and combining the partial SRAF guidance map and the second partial SRAF guidance map.

10. The computer-readable medium of claim 6, further comprising generating SRAF placement rules using the SRAF guidance map.

11. Mask layout data updated after an application of optical proximity correction including sub-resolution assist features (SRAFs), wherein the sub-resolution assist features were placed according to an SRAF guidance map generated by a computer from an initial mask layout that is obtained, wherein the SRAF guidance map is an image having a plurality of pixels corresponding to the initial mask layout, and wherein the SRAF guidance map was generated by computing, for each pixel in the image, whether a sub-resolution assist feature located in the initial mask layout corresponding to the pixel would contribute positively to edge behavior of features in the initial mask layout.

12. The mask layout data of claim 11, wherein the SRAF guidance map was generated by:

computing the inverse Fourier Transform of a most significant eigenvector of transmission cross coefficients that represent the optical path of an exposure tool;

computing the Fourier Transform of the initial mask layout;

multiplying the inverse Fourier Transform by the sum square of frequency and the Fourier Transform of the initial mask layout to produce a product; and computing the inverse Fourier Transform of the product to produce the SRAF guidance map.

13. The mask layout data of claim 11, wherein the SRAF guidance map was generated by:
  computing a bilinear SRAF guidance map kernel using the transmission crosscoefficients that represent the optical path of an exposure tool;
  computing a linear SRAF guidance map kernel using the transmission cross-coefficients;
  computing a partial SRAF guidance map using the bilinear SRAF guidance map kernel and the initial mask layout;
  computing a second partial SRAF guidance map using the linear SRAF guidance map kernel and the initial mask layout; and
  combining the partial SRAF guidance map and the second partial SRAF guidance map.

14. A mask having an updated mask layout after an application of optical proximity correction that includes sub-resolution assist features (SRAFs), wherein the sub-resolution assist features were placed according to an SRAF guidance map generated by a computer from an initial mask layout that is obtained, wherein the SRAF guidance map is an image having a plurality of pixels corresponding to the initial mask layout, and wherein the SRAF guidance map was generated by computing, for each pixel in the image, whether a sub-resolution assist feature located in the mask layout corresponding to the pixel would contribute positively to through-focus and through-dose edge behavior of features in the initial mask layout.

15. The mask of claim 14, wherein the SRAF guidance map was generated by:
  computing the inverse Fourier Transform of a most significant eigenvector of transmission cross coefficients that represent the optical path of an exposure tool;
  computing the Fourier Transform of the mask layout;
  multiplying the inverse Fourier Transform by the sum square of frequency and the Fourier Transform of the mask layout to produce a product; and
  computing the inverse Fourier Transform of the product to produce the SRAF guidance map.

16. The mask of claim 14, wherein the SRAF guidance map was generated by:
  computing a bilinear SRAF guidance map kernel using the transmission crosscoefficients that represent the optical path of an exposure tool;
  computing a linear SRAF guidance map kernel using the transmission cross-coefficients;
  computing a partial SRAF guidance map using the bilinear SRAF guidance map kernel and the initial mask layout;
  computing a second partial SRAF guidance map using the linear SRAF guidance map kernel and the initial mask layout; and
  combining the partial SRAF guidance map and the second partial SRAF guidance map.

* * * * *